(12) United States Patent
Yamazaki et al.

(10) Patent No.: US 9,697,788 B2
(45) Date of Patent: Jul. 4, 2017

(54) LIQUID CRYSTAL DISPLAY DEVICE

(75) Inventors: Shunpei Yamazaki, Setagaya (JP); Jun Koyama, Sagamihara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 818 days.

(21) Appl. No.: 13/093,184

(22) Filed: Apr. 25, 2011

(65) Prior Publication Data

US 2011/0267331 A1 Nov. 3, 2011

(30) Foreign Application Priority Data

Apr. 28, 2010 (JP) ................. 2010-104441

(51) Int. Cl.
*G09G 3/36* (2006.01)
*G11C 19/18* (2006.01)
*G11C 19/28* (2006.01)

(52) U.S. Cl.
CPC ......... *G09G 3/3677* (2013.01); *G09G 3/3688* (2013.01); *G11C 19/184* (2013.01);
(Continued)

(58) Field of Classification Search
CPC ....................................................... G09G 3/36
(Continued)

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1189192 A  3/2002
EP  1296174 A  3/2003
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Kent Chang
*Assistant Examiner* — Sepideh Ghafari
(74) *Attorney, Agent, or Firm* — Robinson Intellectual Property Law Office; Eric J. Robinson

(57) ABSTRACT

A liquid crystal display device includes a pixel portion, a selection signal output circuit which outputs a selection signal in the first operation mode and stops outputting the selection signal in a second operation mode, a pixel data signal output circuit which generates and outputs a pixel data signal, and a backlight unit including a cold cathode fluorescent lamp. The pixel portion includes: a transistor which includes a gate electrode supplied with a selection signal and a source electrode and a drain electrode one of which is supplied with a pixel data signal in a first operation mode and which remains off in a second operation mode; a first electrode electrically connected to the other of the source electrode and the drain electrode of the transistor; a second electrode; and a liquid crystal. The transistor includes an oxide semiconductor layer in which a channel is formed.

15 Claims, 20 Drawing Sheets

(52) U.S. Cl.
CPC ..... *G11C 19/28* (2013.01); *G09G 2310/0286* (2013.01); *G09G 2320/10* (2013.01); *G09G 2330/021* (2013.01); *G09G 2340/0435* (2013.01)

(58) Field of Classification Search
USPC .......................................... 345/93, 98, 100
See application file for complete search history.

(56) References Cited

U.S. PATENT DOCUMENTS

| | | | |
|---|---|---|---|
| 5,977,940 A | 11/1999 | Akiyama et al. | |
| 6,294,274 B1 | 9/2001 | Kawazoe et al. | |
| 6,521,913 B1 | 2/2003 | Murade | |
| 6,563,174 B2 | 5/2003 | Kawasaki et al. | |
| 6,727,522 B1 | 4/2004 | Kawasaki et al. | |
| 6,765,230 B2 | 7/2004 | Murade | |
| 6,770,909 B2 | 8/2004 | Murade | |
| 6,872,975 B2 | 3/2005 | Murade | |
| 7,019,738 B2 | 3/2006 | Tsutsui | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,212,185 B2 | 5/2007 | Yanagi et al. | |
| 7,282,782 B2 | 10/2007 | Hoffman et al. | |
| 7,286,108 B2 | 10/2007 | Tsuda et al. | |
| 7,297,977 B2 | 11/2007 | Hoffman et al. | |
| 7,321,353 B2 | 1/2008 | Tsuda et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,791,074 B2 | 9/2010 | Iwasaki | |
| 7,808,495 B2 | 10/2010 | Tsutsui | |
| 7,863,607 B2 | 1/2011 | Lee et al. | |
| 7,924,276 B2 | 4/2011 | Tsuda et al. | |
| 8,115,201 B2 | 2/2012 | Yamazaki et al. | |
| 8,158,974 B2 | 4/2012 | Yano et al. | |
| 8,259,051 B2 * | 9/2012 | Lee | 345/93 |
| 8,471,252 B2 * | 6/2013 | Yamazaki et al. | 257/43 |
| 8,492,760 B2 | 7/2013 | Yamazaki et al. | |
| 8,642,402 B2 | 2/2014 | Yano et al. | |
| 8,779,419 B2 | 7/2014 | Yano et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0149576 A1 * | 10/2002 | Tanaka et al. | 345/204 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0212737 A1 | 9/2005 | Yoshihara et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0262054 A1 * | 11/2006 | Yamazaki | G09G 3/20 345/77 |
| 2006/0274025 A1 * | 12/2006 | Lai | 345/102 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0055218 A1 | 3/2008 | Tsuda et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0158137 A1 | 7/2008 | Yoshida | |
| 2008/0166834 A1 | 7/2008 | Kim et al. | |
| 2008/0170028 A1 * | 7/2008 | Yoshida | G09G 3/20 345/100 |
| 2008/0182358 A1 | 7/2008 | Cowdery-Corvan et al. | |
| 2008/0191989 A1 * | 8/2008 | Lee et al. | 345/98 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0236596 A1 * | 9/2009 | Itai | H01L 29/78618 257/43 |
| 2009/0261325 A1 | 10/2009 | Kawamura et al. | |
| 2009/0267064 A1 | 10/2009 | Yano et al. | |
| 2009/0278122 A1 | 11/2009 | Hosono et al. | |
| 2009/0280600 A1 | 11/2009 | Hosono et al. | |
| 2009/0303170 A1 | 12/2009 | Chung et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0156850 A1 | 6/2010 | Kurokawa | |
| 2011/0090183 A1 | 4/2011 | Yamazaki et al. | |
| 2011/0090204 A1 | 4/2011 | Yamazaki et al. | |
| 2012/0026163 A1 * | 2/2012 | Koyama | H04N 13/0422 345/419 |

FOREIGN PATENT DOCUMENTS

| | | |
|---|---|---|
| EP | 1391871 A | 2/2004 |
| EP | 1737044 A | 12/2006 |
| EP | 2226847 A | 9/2010 |

(56) References Cited

FOREIGN PATENT DOCUMENTS

| | | |
|---|---|---|
| EP | 2309485 A | 4/2011 |
| JP | 58-066477 A | 4/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-243994 A | 9/1997 |
| JP | 11-505377 | 5/1999 |
| JP | 2000-044236 A | 2/2000 |
| JP | 2000-150900 A | 5/2000 |
| JP | 2001-312253 A | 11/2001 |
| JP | 2002-076356 A | 3/2002 |
| JP | 2002-091396 A | 3/2002 |
| JP | 2002-289859 A | 10/2002 |
| JP | 2003-086000 A | 3/2003 |
| JP | 2003-086808 A | 3/2003 |
| JP | 2004-078124 A | 3/2004 |
| JP | 2004-103957 A | 4/2004 |
| JP | 2004-273614 A | 9/2004 |
| JP | 2004-273732 A | 9/2004 |
| JP | 2005-283775 | 10/2005 |
| JP | 2008-033066 A | 2/2008 |
| JP | 2008-282913 A | 11/2008 |
| JP | 2008-311616 A | 12/2008 |
| JP | 2010-062546 A | 3/2010 |
| WO | WO-00/31714 | 6/2000 |
| WO | WO-2004/114391 | 12/2004 |
| WO | WO-2008/096768 | 8/2008 |
| WO | WO-2008/117739 | 10/2008 |
| WO | WO-2009/031381 | 3/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5) $InGaO_3(ZnO)3$, and $Ga_2O_3(ZnO)m$ (m = 7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Displays Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Seiko Amano et al., "Kahen frame shuhasu o mochiita IGZO TFT kudo no teishohidenryoku (Low Power LC Display Using In—Ga—Zn-Oxide TFTs Based on Variable Frame Frequency)", Display Gijutsu Nenkan , Nov. 10, 2010, pp. 38-42, Nikkei Business Publications.

(56) References Cited

OTHER PUBLICATIONS

Amano.S et al., "Low Power LC Display Using In—Ga—Zn-Oxide TFTs Based on Variable Frame Frequency", SID Digest '10 : SID International Symposium Digest of Technical Papers, 2010, vol. 41, pp. 626-629.

Japanese Office Action (Application No. 2011-099900) Dated Mar. 10, 2014.

Japanese Office Action (Application No. 2011-099900) Dated Mar. 10, 2015.

* cited by examiner

LIQUID CRYSTAL DISPLAY DEVICE

BACKGROUND OF THE INVENTION

1. Field of the Invention

An embodiment of the present invention relates to a liquid crystal display device.

2. Description of the Related Art

In recent years, techniques for reducing power consumed in liquid crystal display devices have been developed.

For example, as one of methods for reducing power consumption of the liquid crystal display devices, can be given a technique in which an interval between image rewriting operations in a pixel in displaying a still image is longer than an interval between image rewriting operations in the pixel in displaying a moving image and thus unnecessary image rewriting operation in displaying a still image is reduced and power consumption of the liquid crystal display devices is reduced (e.g., Patent Document 1).

REFERENCE

[Patent Document 1] Japanese Published Patent Application No. 2005-283775

SUMMARY OF THE INVENTION

However, in the conventional method for reducing power consumption which is disclosed in Patent Document 1, an interval between image rewriting operations in a pixel in displaying a still image is short; therefore, power consumption cannot be sufficiently reduced.

Further in the above liquid crystal display devices, the luminance of a display image changes with temperature change, and even in the case of displaying a still image, the change in luminance gradually becomes larger as the time passes, thereby degrading the display quality. Thus, it is difficult to prolong the interval between rewriting operations. For example, temperature change causes an increase in off-state current of a transistor provided in a pixel, which makes change in luminance of a display image.

The temperature change in the liquid crystal display device is caused, for example, by heat generated by light emission of a backlight unit. For example, as compared to a backlight unit using a light emitting diode (LED) as a light source, a backlight unit using a cold cathode fluorescent lamp has higher emission efficiency and is easily applied to a large-sized liquid crystal display device. However, the backlight unit using a cold cathode fluorescent lamp as a light source has a large amount of heat generation; accordingly, temperature of the liquid crystal display device changes significantly. Therefore, in the liquid crystal display device including a backlight unit using a cold cathode fluorescent lamp, it is difficult to provide a long interval between image rewriting operations in a pixel without degradation of display quality, and power consumption cannot be sufficiently reduced. Further, in the case of a liquid crystal display device for full color display, since one pixel includes a plurality of unit pixels, it is affected by change in display quality more easily than a liquid crystal display device for monochrome display including the same number of pixels as the full-color liquid crystal display device. According to the above, it is difficult to provide a long interval between image rewriting operations in a pixel, and power consumption cannot be sufficiently reduced.

An object of one embodiment of the present invention is to reduce power consumption of a liquid crystal display device.

One embodiment of the present invention includes a first operation mode and a second operation mode as operation modes. In the first operation mode, a selection signal is output from a circuit which outputs a selection signal used for selecting a pixel to which a pixel data is written. In the second operation mode, operation of the circuit which outputs a selection signal used for selecting a pixel to which a pixel data is written is stopped.

One embodiment of the present invention is a liquid crystal display device including: a pixel portion; a selection signal output circuit which outputs a selection signal in a first operation mode and stops outputting the selection signal in a second operation mode; a pixel data signal output circuit which is supplied with an image signal, generates a pixel data signal in accordance with the inputted image signal, and outputs the pixel data signal; and a backlight unit which includes a cold cathode fluorescent lamp as a light source and emits light to the pixel portion. The pixel portion includes: a transistor including a source electrode, a drain electrode, and a gate electrode, where in the first operation mode, the selection signal is input to the gate electrode and the pixel data signal is input to one of the source electrode and the drain electrode, and where in the second operation mode, the transistor remains off; a first electrode which is electrically connected to the other of the source electrode and the drain electrode of the transistor; a second electrode; and a liquid crystal including a plurality of liquid crystal molecules to which a voltage is applied through the first electrode and the second electrode. The transistor includes an oxide semiconductor layer in which a channel is formed and a carrier concentration is lower than $1 \times 10^{14}/cm^3$.

One embodiment of the present invention is a liquid crystal display device including: a pixel portion; a selection signal output circuit which outputs X (X is a natural number) selection signals in a first operation mode and stops outputting the X selection signals in a second operation mode; a pixel data signal output circuit which is supplied with an image signal, generates Y (Y is a natural number) pixel data signals in accordance with the inputted image signal, and outputs the Y pixel data signals; and a backlight unit which includes a cold cathode fluorescent lamp as a light source and emits light to the pixel portion. The pixel portion includes: N (N is a natural number greater than or equal to 3) transistors each including a source electrode, a drain electrode, and a gate electrode, where in the first operation mode, any of the X selection signals is input to gate electrode of each of the N transistors and any of the Y pixel data signals is input to the source electrode or the drain electrode of each of the N transistors, and where in the second operation mode, each of the N transistors remains off; N first electrodes are electrically connected to respective electrodes each of which is the other of the source electrode and the drain electrode of each of the N transistors; a second electrode; a liquid crystal including a plurality of liquid crystal molecules to which voltage is applied through each of the N first electrodes and the second electrode; and K (K is a natural number greater than or equal to 3 and less than or equal to N) color filters that overlap with the respective first electrodes of the N first electrodes. Each of the N transistors includes an oxide semiconductor layer in which a channel is formed and a carrier concentration is lower than $1 \times 10^{14}/cm^3$.

According to one embodiment of the present invention, an interval between image rewriting operations can be made longer as necessary; thus, power consumption can be reduced. For example, even in a liquid crystal display device which includes a backlight unit provided with a cold cathode fluorescent lamp, an interval between image rewriting operations can be made longer as necessary; thus, power consumption can be reduced.

DETAILED DESCRIPTION OF THE INVENTION

Examples of embodiments describing the present invention will be described with reference to the drawings below.

Note that the present invention is not limited to the following description, and it will be easily understood by those skilled in the art that various changes and modifications can be made without departing from the spirit and scope of the invention. Therefore, the present invention should not be construed as being limited to the following description of the embodiments.

Note that contents of the embodiments can be appropriately combined with each other or replaced with each other.

Further, in this specification, the term "k (k is a natural number)" is used in order to avoid confusion among components, and the terms do not limit the components numerically.

(Embodiment 1)

In this embodiment, a liquid crystal display device in which rewriting operation can be selectively stopped will be described.

An example of the liquid crystal display device in this embodiment will be described with reference to FIGS. 1A to 1D. FIGS. 1A to 1D illustrate examples of the liquid crystal display device in this embodiment.

Figure 1A:
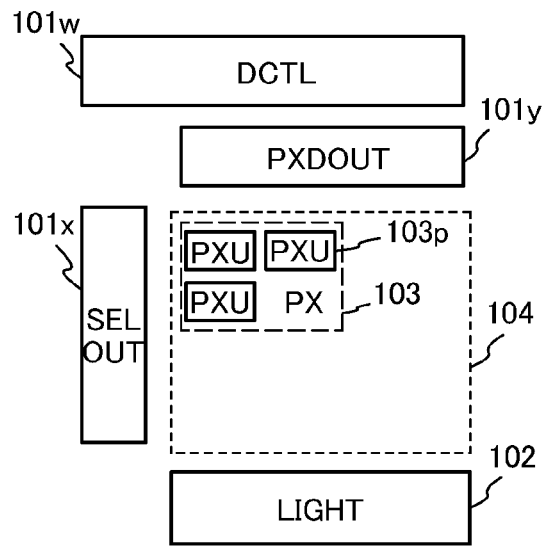
FIGS. 1A to 1D illustrate a liquid crystal display device according to Embodiment 1.

First, a structural example of the liquid crystal display device in this embodiment is described with reference to FIG. 1A. FIG. 1A is a block diagram illustrating an example of the structure of the liquid crystal display device in this embodiment.

The liquid crystal display device illustrated in FIG. 1A includes a selection signal output circuit (also referred to as SELOUT) 101x, a pixel data signal output circuit (also referred to as PXDOUT) 101y, a backlight unit (also referred to as LIGHT) 102, and a pixel (also referred to as PX) 103.

The selection signal output circuit 101x has a function of outputting X (X is a natural number) selection signals SEL. For example, a start signal, a clock signal, and a power supply voltage are input to the selection signal output circuit 101x, whereby X selection signals SEL are output. For example, in the case where the selection signal output circuit 101x includes a shift register, a start signal, a clock signal, and a power supply voltage are input to the shift register, and a pulse signal to be a selection signal SEL is output by the shift register, whereby the X selection signals SEL can be output.

Note that voltage generally refers to a difference between potentials at two points (also referred to as a potential difference). However, values of both a voltage and a potential are represented using volt (V) in a circuit diagram or the like in some cases, so that it is difficult to discriminate between them. This is why in this specification, a potential difference between a potential at one point and a potential to be the reference (also referred to as the reference potential) is used as a voltage at the point in some cases.

An image signal IMG is input to the pixel data signal output circuit 101y. The pixel data signal output circuit 101y has functions of generating Y (Y is a natural number) pixel data signals PXD from the inputted image signal IMG and outputting the generated Y pixel data signals PXD. The pixel data signal output circuit 101y outputs a pixel data signal PXD when a start signal, a clock signal, and a power supply voltage are input thereto, for example. The pixel data signal output circuit 101y includes, for example, a shift register, a memory circuit, and an analog switch. By inputting a start signal, a clock signal, and a power supply voltage to the shift register, the shift register outputs a pulse signal. Data of the image signal IMG is stored in the memory circuit in accordance with the pulse signal, and the analog switch is turned on. By the operation, the pixel data signal output circuit 101y can output the stored data of the image signal IMG as the Y pixel data signals PXD.

Note that as illustrated in FIG. 1A, with use of a display control circuit (also referred to as DCTL) 101w, operation of the selection signal output circuit 101x and the pixel data signal output circuit 101y can be controlled. The display control circuit 101w is not necessarily provided.

The display control circuit 101w has a function of controlling whether to output a start signal, a clock signal, and a power supply voltage to the selection signal output circuit 101x and the pixel data signal output circuit 101y. In addition, the display control circuit 101w may have a function of controlling whether to output the image signal IMG to the pixel data signal output circuit 101y. For example, by input of a control signal, the display control circuit 101w outputs a start signal, a clock signal, and a power supply voltage; or an image signal IMG, a start signal, and a power supply voltage, in accordance with the inputted control signal.

The control signal is generated, for example, in accordance with the image signal IMG to be input or a signal commanded by a user. In the case where a control signal is generated in accordance with the image signal IMG, pieces of data of image signals IMG in successive frame periods are compared, and a control signal whose pulse is determined depending on the comparison result can be generated. Alternatively, in the case where a control signal is generated in accordance with a command signal, for example, input from a user with an input device (e.g., a keyboard or a pointing device such as a mouse or touch panel) is detected, whereby in accordance with the input operation by the user, a control signal whose pulse is determined depending on the comparison result can be generated.

The backlight unit 102 is a light-emitting unit provided with a light source. The backlight unit 102 includes a cold cathode fluorescent lamp as a light source and has a function of emitting light. Note that the backlight unit 102 may be provided with a light control circuit, so that luminance of light emitted or timing of lighting is controlled by the light control circuit.

The pixel 103 is provided in a pixel portion 104. The pixel portion 104 is a region where display is performed in accordance with an inputted pixel data signal PXD. Note that the liquid crystal display device in this embodiment may include a plurality of pixels 103.

Here, a structural example of the pixel portion 104 is described.

The pixel 103 includes N (N is a natural number greater than or equal to 3) unit pixels (also referred to as PXU) 103p. In addition, N transistors, N pixel electrodes used as N first electrodes, a common electrode used as a second electrode, liquid crystal, and K (K is a natural number greater than or equal to 3 and less than or equal to N) color filters are included. The N unit pixels 103p are constituted by the N transistors, the N first electrodes, the second electrode, the liquid crystal, and the K color filters. Note that the number of unit pixels in the pixel 103 is not limited to N as long as at least one unit pixel is provided. There is no particular limitation on the number of pixel data signals to be input to the pixel 103 in that case as long as at least one pixel data signal is input.

Note that in the liquid crystal display device, the transistor is a field-effect transistor having at least a source electrode, a drain electrode, and a gate electrode unless otherwise specified.

Any of the X selection signals SEL is input to the gate electrode of each of the N transistors. Any of Y pixel data signal PXD is input to the source electrode or the drain electrode of each of the N transistors. In the case where X is greater than or equal to 2, selection signals SEL which are different from each other may be input to the gate electrodes of at least two or more transistors. Alternatively, one selection signal SEL may be input to the gate electrodes of the at least two or more transistors. In the case where Y is greater than or equal to 2, pixel data signals PXD which are different from each other may be input to each of the source electrodes or the drain electrodes of two or more transistors. Alternatively, one pixel data signal PXD may be input to each of the source electrodes or the drain electrodes of the two or more transistors.

Each of the N transistors can be a transistor including a semiconductor layer which has extremely a small amount of carriers. For example, a transistor including an oxide semiconductor layer can be used. The oxide semiconductor layer functions as a layer in which a channel is formed (also referred to as a channel formation layer). The oxide semiconductor layer is an intrinsic (an i-type) or substantially intrinsic semiconductor layer having an extremely small amount of carriers whose concentration is lower than $1\times10^{14}/cm^3$, preferably lower than $1\times10^{12}/cm^3$, further preferably lower than $1\times10^{11}/cm^3$.

The off-state current per micrometer of the channel width of the transistor including an oxide semiconductor layer functioning as a channel formation layer is less than or equal to 10 aA ($1\times10^{-17}$ A), preferably 1 aA ($1\times10^{-18}$ A), further preferably 10 zA ($1\times10^{-20}$ A), further preferably 1 zA ($1\times10^{-21}$ A), much further preferably 100 yA ($1\times10^{-22}$ A).

Since the oxide semiconductor layer has low carrier concentration, the off-state current of the transistor including an oxide semiconductor layer is in the above range even when temperature changes. For example, when the temperature of the transistor is 150° C., the off-state current per micrometer of the channel width of the transistor is preferably 100 zA or less.

When the above transistor is used for the transistor of the pixel 103, variation in the display state of the pixel, which is caused by the off-state current of the transistor, can be suppressed, whereby a holding period of a unit pixel which corresponds to onetime writing of pixel data can be made longer. Therefore, the interval between operations of writing pixel data can be prolonged. For example, the interval between the operations of writing pixel data can be 10 seconds or longer, preferably 30 seconds or longer, further preferably 1 minute or longer. Further, in the case where the pixel data is not written, a circuit which operates at the time of writing pixel data can be stopped. Thus, as the interval between the operations of writing pixel data is made longer, the power consumption can be further reduced.

The N pixel electrodes are electrically connected to respective electrodes each of which is the other of the source electrode and the drain electrode of each of the N transistors. The N pixel electrodes and the common electrode may have light-transmitting properties.

The K color filters overlap with the respective pixel electrodes of the N pixel electrodes. For example, the K color filters include color filters transmitting light of at least colors of red, green, and blue. The K color filters are not limited to the color filters transmitting light of red, green, and blue, and color filters transmitting light of another color such as cyan, magenta, or yellow may be combined or replaced with the color filters of red, green, and blue.

The liquid crystal includes a plurality of liquid crystal molecules. Voltage is applied to the plurality of liquid crystal molecules by the N pixel electrodes and the common electrode.

As the liquid crystal, for example, an electrically controlled birefringence liquid crystal (also referred to as an ECB liquid crystal), a liquid crystal to which dichroic pigment is added (also referred to as a GH liquid crystal), a polymer-dispersed liquid crystal, a discotic liquid crystal, or the like can be used. A liquid crystal exhibiting a blue phase may be used as the liquid crystal. The liquid crystal exhibiting a blue phase contains, for example, a liquid crystal composition including a liquid crystal exhibiting a blue phase and a chiral agent. The liquid crystal exhibiting a blue phase has a short response time of 1 msec or less and is optically isotropic; therefore, alignment treatment is not necessary and viewing angle dependence is small. Therefore, with the liquid crystal layer exhibiting a blue phase, the operation speed can be increased.

For example, as illustrated in FIG. 1A, the pixel 103 can be constituted by three unit pixels 103p corresponding to a pixel for exhibiting red, a pixel for exhibiting green, and a pixel for exhibiting blue. The unit pixel 103p corresponding to red includes a color filter transmitting light of a red color, the unit pixel 103p corresponding to green includes a color filter transmitting light of a green color, and the unit pixel 103p corresponding to blue includes a color filter transmitting light of a blue color. In this case, each of N and K is 3. When the pixel 103 includes three unit pixels 103p corresponding to the above three colors, full-color display can be performed with the pixel 103. Alternatively, for example, the pixel 103 may be constituted by four unit pixels 103p including the unit pixel 103p corresponding to a white color in addition to the above three unit pixels 103p. The unit pixel 103p corresponding to a white color does not include a color filter. In this case, the above N is 4, and the above K is 3. In the case where white emission is obtained by using additive color mixture of red, green, and blue, light generally attenuates because of presence of color filters. However, in a structure where white emission is produced with use of the unit pixel 103p including no color filter, light incident on the unit pixel 103p corresponding to a white color can be used for display without attenuation; thus, display luminance in the pixel 103 can be improved. Note that although a color filter is not necessarily provided in the pixel 103, if a color filter is provided, full-color display can be performed.

As a display method of the liquid crystal display device illustrated in FIG. 1A, a TN (twisted nematic) mode, an IPS (in-plane-switching) mode, a S™ (super twisted nematic) mode, a VA (vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, an ASV (advanced super view) mode, a FFS (fringe field switching) mode, or the like may be used. In addition, a driving method in which the levels (polarities) of the voltages applied between the pixel electrode and the common electrode are inverted per frame period (the driving method also referred to as inversion driving) may be used for a display method of the liquid crystal display device. By using the inversion driving, an image burn-in can be prevented.

Note that the term "image" means a displayed image formed by pixels in the pixel portion.

The selection signal output circuit 101x and the pixel 103 may be provided over one substrate. Alternatively, at least part of the selection signal output circuit 101x or part of the pixel data signal output circuit 101y, and the pixel 103 may be provided over one substrate. With such a structure, the pixel 103 and another circuit can be formed together in one step.

Figure 1B:
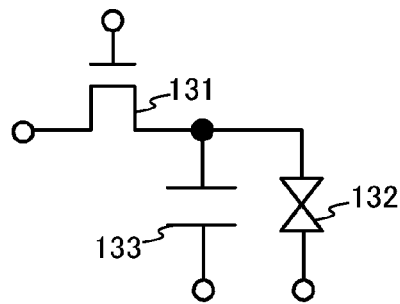

An equivalent circuit of the unit pixel 103p is described with reference to FIG. 1B. FIG. 1B is a diagram showing an equivalent circuit of the unit pixel illustrated in FIG. 1A.

The equivalent circuit of the unit pixel shown in FIG. 1B includes a transistor 131 and a liquid crystal element 132.

The selection signal SEL is input to a gate of the transistor 131, and the pixel data signal PXD is input to one of a source and a drain of the transistor 131.

The liquid crystal element 132 includes a first terminal and a second terminal, and the first terminal of the liquid crystal element 132 is electrically connected to the other of the source and the drain of the transistor 131. Note that a common voltage may be input to the second terminal of the liquid crystal element 132. Further, a switching element is additionally provided, so that the common voltage is input to the second terminal of the liquid crystal element 132 when the switching element is on. The liquid crystal element 132 is included in the pixel 103 and constituted by one of the N pixel electrodes functioning as the first terminal, the common electrode functioning as the second terminal, and liquid crystal.

A source refers to part of or the whole of a source electrode, or part of or the whole of a source wiring. A conductive layer having a function of both a source electrode and a source wiring is referred to as a source in some cases without distinction between a source electrode and a source wiring.

A drain refers to part of or the whole of a drain electrode, or part of or the whole of a drain wiring. A conductive layer having a function of both a drain electrode and a drain wiring is referred to as a drain in some cases without distinction between a drain electrode and a drain wiring.

A gate refers to part or the whole of a gate electrode, or part or the whole of a gate wiring. A conductive layer having a function of both a gate electrode and a gate wiring is referred to as a gate in some cases without distinction between a gate electrode and a gate wiring.

Further, the source and the drain of the transistor may be interchanged in some cases, depending on the structure, the operating condition, or the like of the transistor.

As in FIG. 1B, a capacitor 133 may be provided in the unit pixel 103p. The capacitor 133 has a first terminal and a second terminal. The first terminal of the capacitor 133 is electrically connected to the other of the source and the drain of the transistor 131. The common voltage is input to the second terminal of the capacitor 133. Further, a switching element may be additionally provided, so that the common voltage is input to the second terminal of the capacitor 133 when the switching element is on.

The capacitor 133 functions as a storage capacitor and includes a first electrode functioning as part of or the whole of the first terminal, a second electrode functioning as part of or the whole of the second terminal, and a dielectric body. The capacitance of the capacitor 133 may be set in consideration of the off-state current of the transistor 131. In this embodiment, it is only necessary to provide a storage capacitor having capacitance which is ⅓ or less, preferably ⅕ or less of the capacitance of the liquid crystal element in each display circuit (also referred to as liquid crystal capacitance). The capacitor 133 is not necessarily provided. The unit pixel without the capacitor 133 makes it possible to increase aperture ratio of the unit pixel, and the aperture ratio of the pixel can be accordingly increased.

Figure 1C:
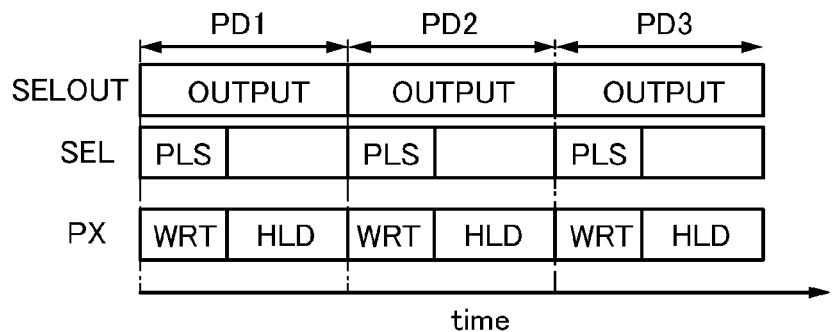
Figure 1D:
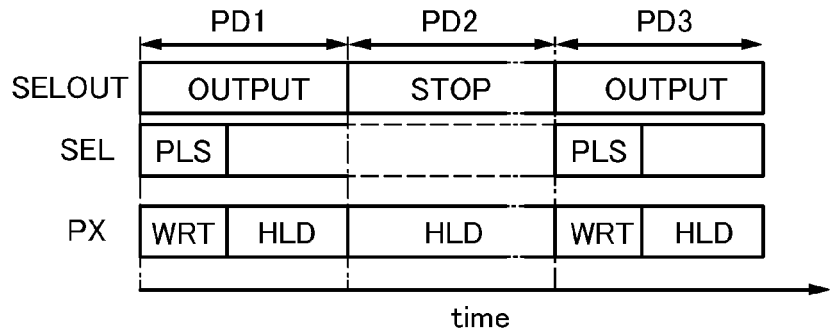

Next, as an example of a method for driving the liquid crystal display device of this embodiment, an example of a method for driving the liquid crystal display device illustrated in FIG. 1A will be described with reference to FIGS. 1C and 1D. FIGS. 1C and 1D are timing charts for describing an example of the driving method of the liquid crystal display device illustrated in FIG. 1A.

The liquid crystal display device illustrated in FIG. 1A has a first operation mode and a second operation mode. The first operation mode and the second operation mode can be switched in accordance with, for example, a control signal from a control circuit or use of a switch separately provided. The operation in each operation mode is described below.

First, as an example, specific pixel data is written to the pixel 103 during the first operation mode. In this case, as shown in periods PD1 in FIGS. 1C and 1D, the selection signal output circuit 101x is in a state where a signal is output (also referred to as a state OUTPUT). The selection signal output circuit 101x outputs X selection signals SEL to the pixel 103.

One selection signal SEL is input to the gate electrodes of transistors in the unit pixels 103p. Each unit pixel 103p to which a pulse of the selection signal SEL is input sets to be in a writing state (also referred to as a state WRT) when the transistors are on. In the writing state, the pixel data signal PXD is written to the unit pixels 103p. In other words, one pixel data signal PXD is input to the pixel electrode of the liquid crystal element in the unit pixel 103p, whereby a display state of the unit pixel 103p is determined in accordance with data (voltage) of the inputted pixel data signal PXD. In such a manner, a display state of each unit pixel 103p is determined, whereby a display state of the pixel 103 is determined.

When pixel data is written to each of the unit pixels 103p, the pixel 103 sets to be in a holding state (also referred to as a state HLD), the transistors of the unit pixels 103p are off, and the determined display states are kept. Note that keeping the display state means that the amount of change in voltage, from an initial value, applied between the N pixel electrodes and the common electrode in the pixel 103 is controlled so as not to be larger than a reference value. The reference value is a voltage value set appropriately, and for example in the case where a user views a displayed image, the reference value is preferably set to a level at which the user can recognize that one image is displayed. At this time, the common electrode in the pixel 103 may be in a floating state, which can suppress variation in voltage of the common electrode.

Further, in the case where the first operation mode is repeated, as shown in a period PD2 and a period PD3 in FIG. 1C, the selection signal output circuit 101x outputs X selection signals SEL to the pixel 103.

The unit pixels 103p to which a pulse of the selection signals SEL is input set to be in a writing state, and one pixel data signal PXD is input to the unit pixels 103p. Depending on the data (voltage) of the inputted pixel data signal PXD, display states of the unit pixels 103p are determined, so that a display state of the pixel 103 is determined. Here, in the case where between the pixel data signal PXD inputted to the pixel 103 provided in the pixel portion 104 in one period and the pixel data signal PXD inputted to the same pixel 103 in the previous period, the absolute value of a difference of data (voltage) is equal to or less than a reference value, images on the pixel portion 104 in the successive periods are a still image. In the case where the absolute value is greater than or equal to the reference value, images on the pixel portion 104 in the successive periods are a moving image. Note that the reference value is a voltage value set appropriately. For example, in the case where a user views a displayed image, the reference value is preferably set to a level at which the user can recognize with eyes that one image is displayed.

The pixel 103 to which pixel data is written sets to be in a holding state and keeps the determined display state.

In the second operation mode, as shown in a period PD2 in FIG. 1D, the selection signal output circuit 101x sets to be in a stopped state (also referred to as a state STOP). At this time, outputting the selection signals SEL from the selection signal output circuit 101x is stopped. For example, by stopping the input operation of a start signal, a clock signal, and a power supply voltage to the selection signal output circuit 101x, the selection signal output circuit 101x sets to be in a stopped state. Note that the description "stopping input or output of a signal or voltage" means that, for example, the voltage of a signal is kept to have a value within a certain range or a wiring to/from which a signal is input/output is in a floating state.

In this case, since the pixel data signal PXD is not input to the pixel 103, the transistors 131 of the unit pixels 103p are kept off. Thus, the pixel 103 keeps the display state in the first operation mode in the previous period (the period PD1 in the case of FIG. 1D). That is, the holding state of the first operation mode in the previous period is kept.

Note that during the period PD2, the pixel data signal output circuit 101y may be in a stopped state. For example, by stopping input operation of an image signal IMG, a start signal, a clock signal, and a power supply voltage to the pixel data signal output circuit 101y, outputting the pixel data signal PXD from the pixel data signal output circuit 101y is stopped. The pixel data signal output circuit 101y is stopped when the selection signal output circuit 101x is in the stopped state, whereby power consumption can be further reduced.

Furthermore, in the case where pixel data is rewritten after the selection signal output circuit 101x is made to be in a stopped state, as shown in a period PD3 in FIG. 1D, the output operation of the selection signal SEL by the selection signal output circuit 101x is restarted, so that the selection signal output circuit 101x outputs the section signal SEL to the pixel 103. For example, by inputting a start signal, a clock signal, and a power supply voltage to the selection signal output circuit 101x again, the selection signal output circuit 101x restarts the operation of outputting selection signals SEL. Note that in the case where the pixel data signal output circuit 101y is made to be in a stopped state under the condition that the selection signal output circuit 101x is in a stopped state, the output operation of pixel data signals PXD by the pixel data signal output circuit 101y is restarted in the period PD3. For example, by inputting a pixel data signal PXD, a start signal, a clock signal, and a power supply voltage to the pixel data signal output circuit 101y again, the pixel data signal output circuit 101y restarts the operation of outputting the pixel data signal PXD.

The unit pixel 103p to which a pulse of the selection signal SEL is input sets to be in a writing state, and one pixel data signal PXD is input to the unit pixel. Thus, a display state of the unit pixel 103p is determined in accordance with the data (voltage) of the inputted pixel data signal PXD, so that a display state of the pixel 103 is determined.

The pixel 103 to which pixel data is written is set to be in a holding state and keeps the determined display state. The above is the operation example of the liquid crystal display device illustrated in FIG. 1A.

In the case where the liquid crystal display device illustrated in FIG. 1A is a transmissive type, the backlight unit 102 emits light toward the pixel 103 in the first operation mode and the second operation mode.

As described with reference to FIGS. 1A to 1D, the liquid crystal display device exemplified in this embodiment is a liquid crystal display device in which a first operation mode and a second operation mode can be selectively switched. Here, the first operation mode is a mode during which display operation is performed by writing pixel data to the pixel, and the second operation mode is a mode during which display operation is performed without writing of pixel data to the pixel. Thus, by applying the second operation mode as necessary, at least the output operation of the selection signal by the selection signal output circuit can be stopped while display is being performed on the pixel. With the above modes, operation of the selection signal output circuit can be stopped in a period during which writing pixel data to the pixel is unnecessary; therefore, power consumption can be reduced.

Further, in the liquid crystal display device exemplified in this embodiment, a transistor in which a highly purified oxide semiconductor layer is used for a channel formation layer is used as a transistor of the unit pixel. Thus, since variation in a display state of a liquid crystal element, which is caused by the off-state current of the transistor, can be suppressed, a period for holding an image corresponding to one writing operation of pixel data can be prolonged. As a result, an interval between the writing operations of pixel data can be made longer, and power consumption can be further reduced. Moreover, even in the case where a cold cathode fluorescent lamp is used as a light source of the backlight unit, variation in a display state of the pixel, which is caused by temperature change of the transistor, can be suppressed. Thus, a period for holding an image corresponding to one operation of writing pixel data can be prolonged. As a result, an interval between writing operations of pixel data can be made longer, and power consumption can be reduced. Moreover, in the case of a liquid crystal display device for full color display in which three or more unit pixels are provided in one pixel, the number of unit pixels is larger than that of a liquid crystal display device for monochrome display under the condition where the number of pixels of the full-color liquid crystal display device is same as that of the monochrome liquid crystal display device; thus, power consumption can be further reduced.

(Embodiment 2)

In this embodiment, an example of a method for generating a control signal will be described.

Figure 2:
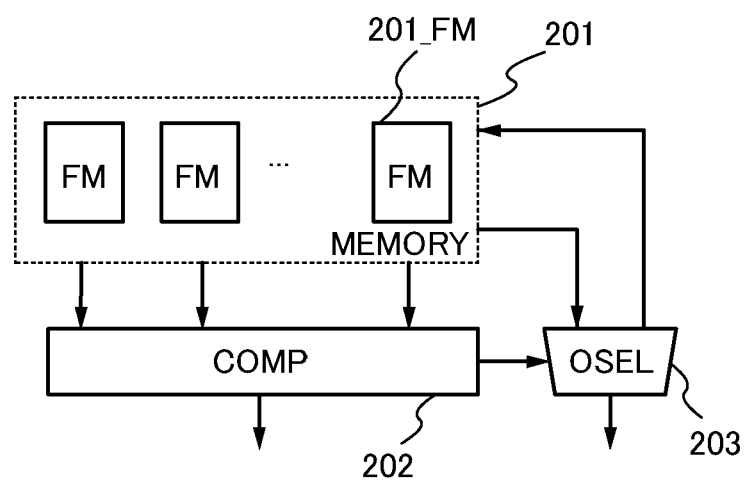
FIG. 2 is a block diagram illustrating a configuration example of a control signal generation circuit according to Embodiment 2.

In the case where a control signal is used in the liquid crystal display device in the above embodiment, a control signal can be generated with use of a control signal generation circuit, for example. An example of a configuration of a control signal generation circuit is described with reference to FIG. 2. FIG. 2 is a block diagram showing a configuration example of the control signal generation circuit in this embodiment.

The control signal generation circuit illustrated in FIG. 2 includes a memory circuit (also referred to as MEMORY) 201, a comparison circuit (also referred to as COMP) 202, and an output selection circuit (also referred to as OSEL) 203.

Image signals IMG are input to the memory circuit 201. The memory circuit 201 has a function of storing data of the image signals IMG to be inputted sequentially. The memory circuit 201 includes a plurality of frame memories 201_FM for storing data of the image signals IMG corresponding to images in a plurality of frame periods. The frame memory 201_FM is illustrated in FIG. 2 in order to conceptually indicate a memory region for one frame period. The number of frame memories 201_FM of the memory circuit 201 is not particularly limited as long as the memory circuit 201 can store data of the image signals IMG corresponding to images in a plurality of frame periods. Note that the frame memory 201_FM is formed using a memory element such as a dynamic random access memory (DRAM) or a static random access memory (SRAM).

The comparison circuit 202 is a circuit which reads out data of image signals IMG corresponding to images in successive frame periods from the memory circuit 201, compares the data of the image signals IMG, generates a control signal CTL whose pulse is determined in accordance with the comparison result, and outputs the generated control signal CTL.

For example, the comparison circuit 202 checks whether there is a difference in the compared data (voltage) of the image signals IMG and judges whether the images corresponding to the compared data of image signals IMG are a moving image or a still image.

In the case where the absolute value of a difference between pieces of the data of the image signals IMG corresponding to images in successive frame periods is equal to or less than a reference value, the comparison circuit 202 judges that the image corresponding to the compared data of the image signals IMG is a still image.

In the case where the absolute value of a difference between the pieces of data of the image signals IMG corresponding to images in successive frame periods is equal to or greater than the reference value, the comparison circuit 202 judges that the image corresponding to the compared data of the image signals IMG is a moving image.

Note that the reference value in comparison is a voltage value set appropriately, and for example in the case where a user views a displayed image, the reference value is preferably set to a level at which the user can recognize that one image is displayed.

The output selection circuit 203 is a circuit which is supplied with the control signal CTL, and reads out and outputs the data of the image signal IMG stored in the memory circuit 201 in accordance with the inputted control signal CTL. Note that the output selection circuit 203 is not necessarily provided, but when the output selection circuit 203 is provided, in the liquid crystal display device of the above embodiment, the output operation of the image signal IMG to the pixel data signal output circuit can be selectively stopped.

For example, in the case where the image based on the pieces of data of the image signal IMG compared by the comparison circuit 202 is judged as a moving image, the output selection circuit 203 reads out and outputs the data of the image signal IMG from the memory circuit 201, thereby outputting the image signal IMG.

In the case where the image based on the pieces of data of the image signal IMG compared by the comparison circuit 202 is judged as a still image and the frequency judged sequentially as a still image is equal to or less than a reference frequency, the output selection circuit 203 stops reading out the data of the image signal IMG from the memory circuit 201 and then stops outputting the image signal IMG. Note that the reference frequency can be determined appropriately.

The selection output circuit 203 is constituted by a circuit including a plurality of switches, for example. As the switches, transistors can be used, for example.

Note that the control signal generation circuit may be provided with a counting circuit. With the counting circuit, the number of frame periods which are sequentially judged to have data for displaying a still image is counted, and when the counted value exceeds a reference value, operation that is the same as operation in the case where data is judged as data for displaying a moving image can be performed by the control signal generation circuit.

The above control signal generation circuit may be provided in the liquid crystal display device in the above embodiment. Alternatively, the control signal generation circuit may be separately provided and electrically connected to the liquid crystal display device in the above embodiment.

As described with reference to FIG. 2, the control signal generation circuit in this embodiment can judge whether the pixel data in successive frame periods is for a moving image or a still image and can set a pulse of a control signal CTL which is generated in accordance with the judgment result. Therefore, when a pulse of a control signal CTL is input for example, the selection signal output circuit in the liquid crystal display device in the above embodiment can be set to output a selection signal.

(Embodiment 3)

In this embodiment, an example of a shift register which can be used in a selection signal output circuit and a pixel data signal output circuit of the liquid crystal display device described in the above embodiment will be described.

Figure 3A:
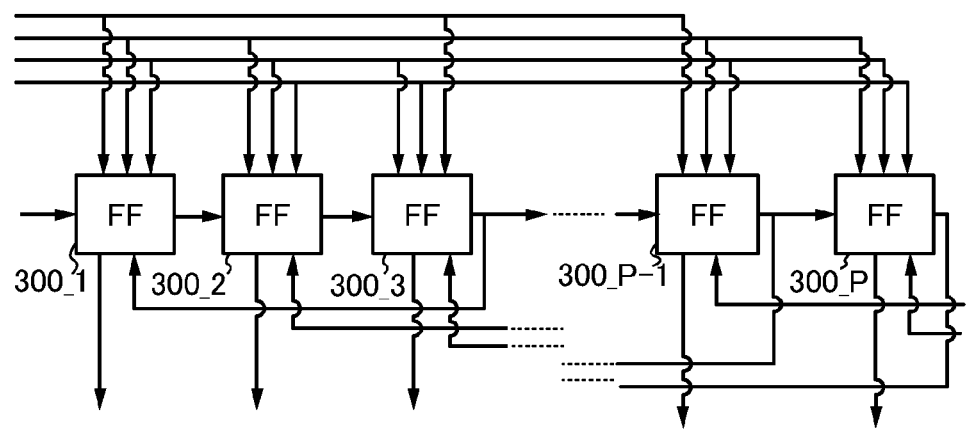
FIGS. 3A and 3B illustrate a configuration example of a shift register according to Embodiment 3.

First, a configuration example of a shift register of this embodiment is described with reference to FIG. 3A. FIG. 3A is a diagram illustrating the configuration example of the shift register.

The shift register in FIG. 3A includes P-stage (P is a natural number greater than or equal to 3) sequential circuits (also referred to as FFs).

To the shift register in FIG. 3A, a start signal SP is input as a start signal and a clock signal CLK1, a clock signal CLK2, a clock signal CLK3, and a clock signal CLK4 are input as clock signals. By using the plurality of clock signals, the speed of outputting a signal in the shift register can be increased.

As a signal in the shift register of this embodiment, for example, a signal with voltage can be used. As the signal with voltage (also referred to as a voltage signal), an analog signal or a digital signal, which has at least first voltage and second voltage, can be used. For example, a binary digital signal such as a clock signal becomes at a low level and a high level, thereby having the first voltage (low-level voltage) and the second voltage (high-level voltage). Further, each of the high-level voltage and the low-level voltage preferably has a fixed value. However, since noise or the like has an influence on an electronic circuit, each of the high-level voltage and the low-level voltage does not necessarily have a fixed value and may have a value within a certain range where a value can be seen as substantially equivalent.

The sequential circuits are described below.

Each of the sequential circuits 300_1 to 300_P is supplied with a set signal ST, a reset signal RE, a clock signal CK1, a clock signal CK2, and a clock signal CK3 and outputs a signal OUT1 and a signal OUT2.

The clock signal CK1, the clock signal CK2, and the clock signal CK3 are delayed by a ¼ cycle sequentially. Note that any three of the clock signals CLK1 to CLK4 may be used as each of the clock signal CK1, the clock signal CK2, and the clock signal CK3. The clock signals of the same combination are not input to the sequential circuits adjacent to each other.

Figure 3B:
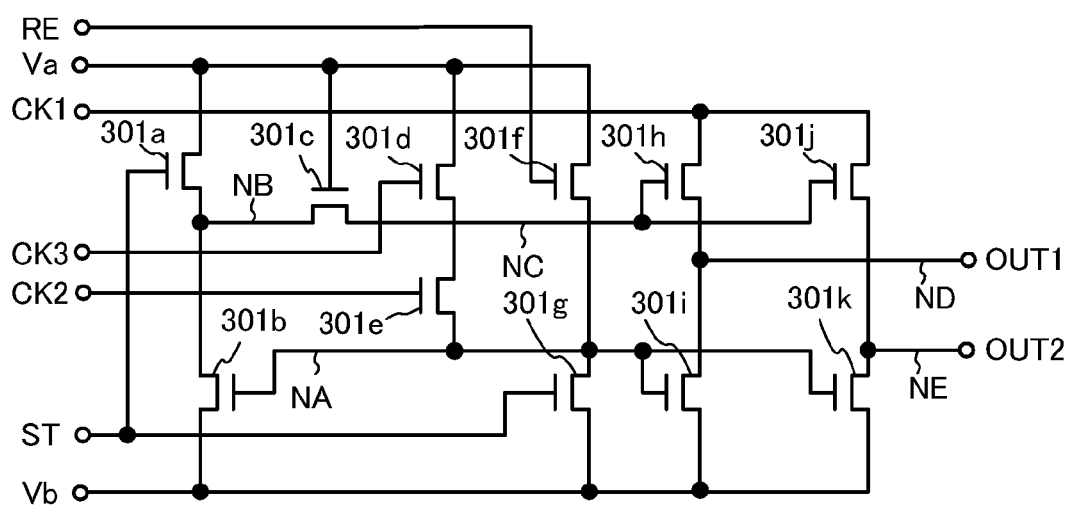

In addition, the circuit configuration of the sequential circuit in FIG. 3A is described with reference to FIG. 3B. FIG. 3B is a circuit diagram illustrating the circuit configuration of the sequential circuit in FIG. 3A.

The sequential circuit illustrated in FIG. 3B includes a transistor 301*a*, a transistor 301*b*, a transistor 301*c*, a transistor 301*d*, a transistor 301*e*, a transistor 301*f*, a transistor 301*g*, a transistor 301*h*, a transistor 301*i*, a transistor 301*j*, and a transistor 301*k*.

A voltage Va is input to one of a source and a drain of the transistor 301*a*, and the set signal ST is input to a gate of the transistor 301*a*.

One of a source and a drain of the transistor 301*b* is electrically connected to the other of the source and the drain of the transistor 301*a*, and a voltage Vb is input to the other of the source and the drain of the transistor 301*b*.

One of a source and a drain of the transistor 301*c* is electrically connected to the other of the source and the drain of the transistor 301*a*, and the voltage Va is input to a gate of the transistor 301*c*.

The voltage Va is input to one of a source and the drain of a transistor 301*d*, and the clock signal CK3 is input to a gate of the transistor 301*d*.

One of a source and a drain of the transistor 301*e* is electrically connected to the other of the source and the drain of the transistor 301*d*, the other of the source and the drain of the transistor 301*e* is electrically connected to a gate of the transistor 301*b*, and the clock signal CK2 is input to a gate of the transistor 301*e*.

The voltage Va is input to one of a source and a drain of the transistor 301*f*, and the reset signal RE is input to a gate of the transistor 301*f*.

One of a source and a drain of the transistor 301*g* is electrically connected to the gate of the transistor 301*b* and the other of the source and the drain of the transistor 301*f*, the voltage Vb is input to the other of the source and the drain of the transistor 301*g*, and the set signal ST is input to a gate of the transistor 301*g*.

The clock signal CK1 is input to one of a source and a drain of the transistor 301*h*, and a gate of the transistor 301*h* is electrically connected to the other of the source and the drain of the transistor 301*c*.

One of a source and a drain of the transistor 301*i* is electrically connected to the other of the source and the drain of the transistor 301*h*, the voltage Vb is input to the other of the source and the drain of the transistor 301*i*, and a gate of the transistor 301*i* is electrically connected to the gate of the transistor 301*b*.

The clock signal CK1 is input to one of a source and a drain of the transistor 301*j*, and a gate of the transistor 301*j* is electrically connected to the other of the source and the drain of the transistor 301*c*.

One of a source and a drain of the transistor 301*k* is electrically connected to the other of the source and the drain of the transistor 301*j*, the voltage Vb is input to the other of the source and the drain of the transistor 301*k*, and a gate of the transistor 301*k* is electrically connected to the gate of the transistor 301*b*.

Note that one of the voltage Va and the voltage Vb is a high power supply voltage Vdd, and the other is a low power supply voltage Vss. The high supply voltage Vdd is a voltage the value of which is relatively higher than that of the low supply voltage Vss. The low supply voltage Vss is a voltage the value of which is relatively lower than that of the high supply voltage Vdd. The value of the voltage Va and the value of the voltage Vb might interchange depending, for example, on the conductivity type of the transistor. A potential difference between the voltage Va and the voltage Vb is power supply voltage.

In FIG. 3B, a portion where the gate of the transistor 301b, the other of the source and the drain of the transistor 301e, the other of the source and the drain of the transistor 301f, and the one of the source and the drain of the transistor 301g, the gate of the transistor 301i, and the gate of the transistor 301k are electrically connected to each other is referred to a node NA. In addition, a portion where the other of the source and the drain of the transistor 301a, the one of the source and the drain of the transistor 301b, and the one of the source and the drain of the transistor 301c are electrically connected to each other is referred to as a node NB. A portion where the other of the source and the drain of the transistor 301c, the gate of the transistor 301h, and the gate of the transistor 301j are electrically connected to each other is referred to as a node NC. A portion where the other of the source and the drain of the transistor 301h and the one of the source and the drain of the transistor 301i are electrically connected to each other is referred to as a node ND. A portion where the other of the source and the drain of the transistor 301j and the one of the source and the drain of the transistor 301k are electrically connected to each other is referred to as a node NE.

The sequential circuit in FIG. 3B outputs a voltage of the node ND and a voltage of the node NE as the signal OUT1 and the signal OUT2, respectively.

Further, the start signal SP is input as the set signal ST to the gate of the transistor 301a and the gate of the transistor 301g in the first sequential circuit 300_1.

The gate of the transistor 301a and the gate of the transistor 301g in the (Q+2)-th (Q is a natural number less than or equal to (P−2)) sequential circuit 300_Q+2 are electrically connected to the other of the source and the drain of the transistor 301h in the (Q+1)-th sequential circuit 300_Q+1. At that time, the signal OUT1 in the sequential circuit 300_Q+1 is the set signal ST in the sequential circuit 300_Q+2.

The other of the source and the drain of the transistor 301h in the U-th (U is a natural number greater than or equal to 3 and less than or equal to P) sequential circuit 300_U is electrically connected to the gate of the transistor 301f in the (U−2)-th sequential circuit 300_U−2. At that time, the signal OUT1 in the sequential circuit 300_U is the reset signal RE in the sequential circuit 300_U−2.

Further, a signal RP1 is input as a reset signal to the gate of the transistor 301f in the (P−1)-th sequential circuit 300_P−1. The signal OUT2 outputted from the (P−1)-th sequential circuit 300_P−1 is not necessarily used to operate the other circuits.

A signal RP2 is input as a reset signal to the gate of the transistor 301f in the P-th sequential circuit 300_P. The signal OUT2 outputted from the P-th sequential circuit 300_P is not necessarily used to operate the other circuits.

The transistors 301a to 301k can have the same conductivity. As each of the transistors 301a to 301k, for example, a transistor including a semiconductor layer in which a channel is formed using a semiconductor belonging to Group 14 (such as silicon) or a transistor applicable to the pixel 103 in the liquid crystal display device in Embodiment 1 can be used.

Figure 4A:
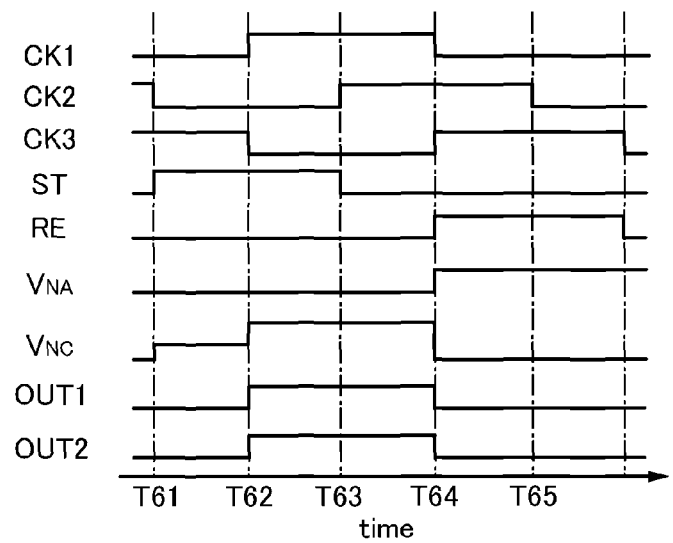
FIGS. 4A and 4B are timing charts for illustrating an operation example of the shift register according to Embodiment 3.

An example of operation of the sequential circuit illustrated in FIG. 3B is described with reference to FIG. 4A. FIG. 4A is a timing chart for describing the example of the operation of the sequential circuit in FIG. 3B. For example, the transistors 301a to 301k in the sequential circuit in FIG. 3B are all n-channel transistors, the threshold voltages of the transistor 301h and the transistor 301j are the same voltage Vth, and the high power supply voltage Vdd and the low power supply voltage Vss are input as the voltage Va and the voltage Vb, respectively.

First, at a time T61, the clock signal CK1 is at a low level, the clock signal CK2 is changed to a low level, the clock signal CK3 is at a high level, the set signal ST is changed to a high level, and the reset signal RE is at a low level.

At that time, the sequential circuit is set to a set state. The transistor 301d and the transistor 301g are turned on and the transistor 301e and the transistor 301f are turned off; therefore, the voltage of the node NA (also referred to as $V_{NA}$) becomes equivalent to the value of the voltage Vb, and the transistor 301b, the transistor 301i, and the transistor 301k are turned off. Further, since the transistor 301a is turned on and the transistor 301b is turned off, the voltage of the node NB (referred to as $V_{NB}$) becomes equivalent to the value of the voltage Va. Further, the transistor 301c is turned on; therefore, the voltage of the node NC (referred to as $V_{NC}$) becomes equivalent to the value of the voltage Va, and the transistor 301h and the transistor 301j are turned on. When the voltage of the node NC becomes equivalent to the value of the voltage Va, the transistor 301c is turned off. Since the transistor 301h is turned on and the transistor 301i is turned off, the signal OUT1 is set to a low level. Since the transistor 301j is turned on and the transistor 301k is turned off, so that the signal OUT2 is set to a low level.

Next, at a time T62, the clock signal CK1 is changed to a high level, the clock signal CK2 remains at a low level, the clock signal CK3 is changed to a low level, the set signal ST remains at a high level, and the reset signal RE remains at a low level.

At this time, the transistor 301d is turned off, and the transistor 301e, the transistor 301f, and the transistor 301g remain in an off state; therefore, the voltage of the node NA remains equivalent to the value of the voltage Vb, and the transistor 301b, the transistor 301i, and the transistor 301k remain in an off state. Since the transistor 301a remains in an on state and the transistor 301c remains in an off state, the voltage of the node NB remains equivalent to the value of the voltage Va. The transistor 301c remains in an off state, whereby the node NC enters a floating state. The transistor 301h remains in an on state, and the transistor 301i remains in an off state, so that the voltage of the node NC is increased. The transistor 301j is in an on state, and the transistor 301k is in an off state, so that the voltage of the node ND is increased. Then, the voltage of the node NC is increased because of capacitive coupling due to parasitic capacitance generated between the gate of the transistor 301h and the other of the source and the drain of the transistor 301h and capacitive coupling due to parasitic capacitance generated between the gate of the transistor 301j and the other of the source and the drain of the transistor 301j. This is so-called bootstrap operation. The voltage of the node NC is increased to a value which is further larger than the sum of the voltage Va and the voltage Vth, i.e., Va+Vth+Vx. At that time, the transistor 301h and the transistor 301j remain in an on state. Further, at that time, the signal OUT1 and the signal OUT2 are set to a high level.

Next, at a time T63, the clock signal CK1 remains at a high level, the clock signal CK2 is changed to a high level, the clock signal CK3 remains at a low level, the set signal ST is changed to a low level, and the reset signal RE remains at a low level.

At that time, the transistor 301e is turned on, the transistor 301g is turned off, and the transistor 301d and the transistor 301f remain in an off state, so that the voltage of the node NA remains equivalent to the value of the voltage Vb, and the transistor 301b, the transistor 301i, and the transistor 301k remain in an off state. Further, since the transistor 301a is turned off, the transistor 301b remains off, and the transistor 301c remains in an off state, the voltage of the node NB remains equivalent to the value of the voltage Va. Further, the transistor 301c remains in an off state, so that the voltage of the node NC remains a value represented by Va+Vth+Vx, and the transistor 301h and the transistor 301j remain in an on state. Since the transistor 301h remains in an on state, and the transistor 301i remains in an off state, the signal OUT1 remains at a high level. Further, the transistor 301j remains in an on state, and the transistor 301k remains in an off state, so that the signal OUT2 remains at a high level.

Next, at a time T64, the clock signal CK1 is changed to a low level, the clock signal CK2 remains at a high level, the clock signal CK3 is changed to a high level, the set signal ST remains at a low level, and the reset signal RE is changed to a high level.

At that time, the sequential circuit is set to a reset state. When the transistor 301h and the transistor 301j are in an on state, the signal OUT1 and the signal OUT2 are at a low level. Further, the transistor 301d and the transistor 301f are turned on, the transistor 301e remains in an on state, and the transistor 301g remains in an off state, so that the voltage of the node NA becomes equivalent to be the value of the voltage Va, and the transistor 301b, the transistor 301i, and the transistor 301k are turned on. The transistor 301b is turned on, and the transistor 301a and the transistor 301c remain in an off state, so that the voltage of the node NB becomes equivalent to the value of the voltage Vb, and the transistor 301c is turned on. Further, the transistor 301c is turned on, so that the voltage of the node NC becomes equivalent to the value of the voltage Vb, and the transistor 301h and the transistor 301j are turned off. Since the transistor 301h is turned off and the transistor 301i is turned on, the signal OUT1 is set to a low level. Since the transistor 301j is turned off and the transistor 301k is turned on, the signal OUT2 is set to a low level.

Next, at a time T65, the clock signal CK1 remains at a low level, the clock signal CK2 is changed to a low level, the clock signal CK3 remains at a high level, the set signal ST remains at a low level, and the reset signal RE remains at a high level.

At this time, the transistor 301e is turned off, the transistor 301d and the transistor 301f remain in an on state, and the transistor 301g remains in an off state; therefore, the voltage of the node NA remains equivalent to the value of the voltage Va, and the transistor 301b, the transistor 301i, and the transistor 301k remains in an on state. Further, the transistor 301a remains in an off state, the transistor 301b and the transistor 301c remains in an on state, and the voltage of the node NB remains equivalent to the value of the voltage Vb. Further, the transistor 301c is turned on; therefore, the voltage of the node NC remains equivalent to the value of the voltage Vb, and the transistor 301h and the transistor 301j remains in an off state. Since the transistor 301h remains in an off state and the transistor 301i remaining in an on state, the signal OUT1 remains at a low level. Since the transistor 301j remains in an off state and the transistor 301k remains in an on state, the signal OUT2 remains at a low level.

As described above, the sequential circuit can output the signal OUT1 and the signal OUT2. The above is an example of the operation of the sequential circuit in FIG. 3B.

Figure 4B:
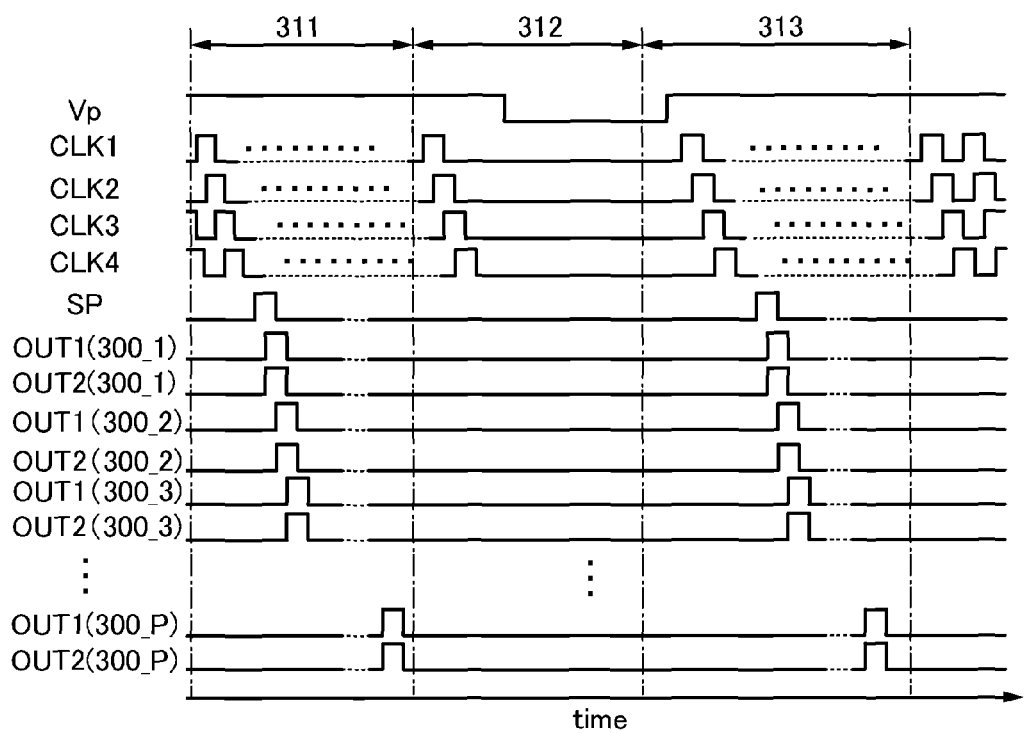

Further, an example of the operation of the shift register in FIG. 3A is described with reference to FIG. 4B. FIG. 4B is a timing chart for describing an example of a driving method of the shift register in FIG. 3A.

In the shift register illustrated in FIG. 3A, operation can be switched in accordance with the first operation mode and the second operation mode of the liquid crystal display device of the above embodiment. Operation in each mode is described below.

First, as an example, operation in the first operation mode is described. In this case, as shown in a period 311 of the FIG. 4B, a start signal SP, a power supply voltage Vp, and clock signals CLK1 to CLK4 are input. A pulse of the start signal SP is input to the first sequential circuit 300_1, whereby pulses of the signals OUT1 and the signals OUT2 of the first sequential circuit 300_1 to P-th sequential circuit 300_P are output sequentially in accordance with the clock signals CLK1 to CLK4. That is, the signals OUT1 and the signals OUT2 of the first sequential circuit 300_1 to P-th sequential circuit 300_P are output.

Next, operation at the time when an operation mode is switched from the first operation mode to the second operation mode is described. In this case, as shown in a period 312 of FIG. 4B, outputs of the power supply voltage Vp, the clock signals CLK1 to CLK4, and the start signal SP to the shift register are stopped.

At this time, the output of the start signal SP to the shift register is stopped first, the outputs of the clock signals CLK1, CLK2, CLK3, and CLK4 to the shift register are sequentially stopped, and then the output of the power supply voltage Vp to the shift register is stopped, so that malfunction of the shift register, of when the outputs of signals from the shift register are stopped, can be suppressed.

When outputs of the power supply voltage Vp, the clock signals CLK1 to CLK4, and start signal SP to the shift register are stopped, outputs of pulses of the signals OUT1 and the signals OUT2 from the first sequential circuit 300_1 to P-th sequential circuit 300_P are stopped. That is, outputs of the signals OUT1 and the signals OUT2 from the first sequential circuit 300_1 to P-th sequential circuit 300_P are stopped. Then, the operation of the liquid crystal display device is accordingly switched to the second operation mode.

In the case where outputs of the signals in the shift register are restarted after the outputs of the signals in the shift register are stopped, as shown in a period 313 of FIG. 4B, outputs of the start signal SP, the clock signals CLK1 to CLK4, and the power supply voltage Vp to the shift register are restarted.

At this time, the output of the power supply voltage Vp to the shift register is restarted first, the outputs of the clock signals CLK1, CLK2, CLK3, and CLK4 to the shift register are sequentially restarted, and then the output of the start signal SP to the shift register is restarted. Moreover, in this case, the clock signals CLK1 to CLK4 are preferably output after the high power supply potential Vdd is applied to a wiring to which the clock signals CLK1 to CLK4 are to be output.

The outputs of the start signal SP, the clock signals CLK1 to CLK4, and the power supply voltage Vp to the shift register are restarted, and a pulse of the start signal SP is input to the first sequential circuit 300_1, whereby in accordance with the clock signals CLK1 to CLK4, pulses of the signals OUT1 and the signals OUT2 of the first sequential circuit 300_1 to the P-th sequential circuit 300_P are sequentially output. That is, the outputs of the signals OUT1 and the signals OUT2 of the first sequential circuit 300_1 to the P-th sequential circuit 300_P are restarted. Then, the operation of the liquid crystal display device is accordingly switched to the first operation mode again.

As described with reference to FIGS. 3A and 3B and FIGS. 4A and 4B, the shift register of this embodiment includes the sequential circuits of the plurality of stages. Each of the plurality of sequential circuits includes a first transistor, a second transistor, and a third transistor. The first transistor has a gate to which a set signal is input and controls whether to turn on the second transistor in accordance with the set signal. The second transistor has a source and a drain one of which is supplied with a clock signal and controls whether to set the voltage of an output signal from the sequential circuit to a value corresponding to the voltage of the clock signal. The third transistor has a gate to which a reset signal is input and controls whether to turn off the second transistor in accordance with the reset signal. With such a structure, the output of signals of the shift register can be easily stopped.

Moreover, the shift register of this embodiment can be used for the selection signal output circuit in the liquid crystal display device of the above embodiment. Thus, a period during which an output of the selection signal is stopped can be provided. With such a structure, the outputs of the start signal, the clock signal, and the power supply voltage to the shift register are stopped, so that the output of the signals of the shift register are stopped, and thus the output of the selection signal can be stopped.

Moreover, the shift register of this embodiment can be used for the pixel data signal output circuit in the liquid crystal display device of the above embodiment. Thus, a period during which the output of the pixel data signal is stopped can be provided. With such a structure, the outputs of the start signal, the clock signal, and the power supply voltage are stopped, so that the output of the signals of the shift register are stopped, and thus the output of the pixel data signal can be stopped.

(Embodiment 4)

In this embodiment, a transistor which can be used in the liquid crystal display device including an oxide semiconductor of the above embodiment will be described.

The transistor including an oxide semiconductor layer described in this embodiment is a transistor including a semiconductor layer which is highly purified to be intrinsic (also referred to as i-type) or substantially intrinsic. High purification is a general idea including at least one of the following cases: the case where hydrogen in an oxide semiconductor layer is removed as much as possible; and the case where oxygen is supplied to an oxide semiconductor layer and defects due to oxygen deficiency of the oxide semiconductor layer are reduced.

An example of a structure of the transistor in this embodiment will be described with reference to FIGS. 5A to 5D. FIGS. 5A to 5D are cross-sectional schematic views each illustrating an example of the structure of the transistor.

Figure 5A:
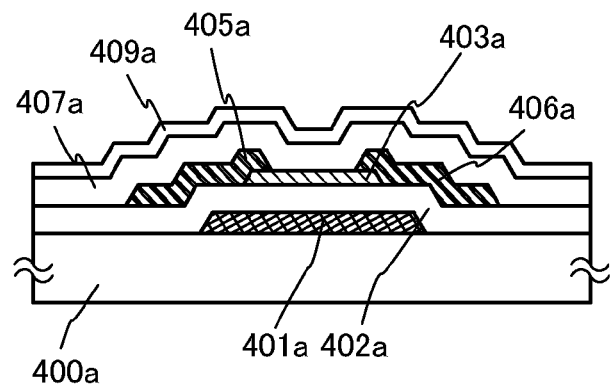
FIGS. 5A to 5D are cross-sectional schematic views each illustrating a structural example of a transistor according to Embodiment 4.

The transistor illustrated in FIG. 5A is one of bottom-gate transistors, which is also referred to as an inverted staggered transistor.

The transistor illustrated in FIG. 5A includes a conductive layer 401a, an insulating layer 402a, an oxide semiconductor layer 403a, a conductive layer 405a, and a conductive layer 406a.

The conductive layer 401a is formed over a substrate 400a, the insulating layer 402a is formed over the conductive layer 401a, the oxide semiconductor layer 403a is formed over the conductive layer 401a with the insulating layer 402a interposed therebetween, and the conductive layer 405a and the conductive layer 406a are each formed over part of the oxide semiconductor layer 403a.

Further, in the transistor illustrated in FIG. 5A, an oxide insulating layer 407a is in contact with part of a top surface of the oxide semiconductor layer 403a (part of the oxide semiconductor layer 403a over which neither the conductive layer 405a nor the conductive layer 406a is provided). In addition, a protective insulating layer 409a is provided over the oxide insulating layer 409a.

Figure 5B:
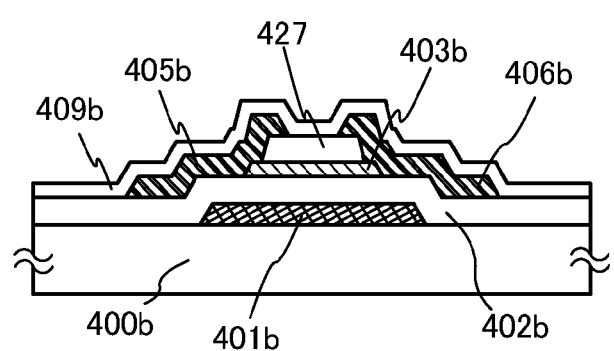

A transistor illustrated in FIG. 5B is one of bottom-gate transistors, which is called a channel-protective (channel-stop) transistor and is also an inverted staggered transistor.

The transistor illustrated in FIG. 5B includes a conductive layer 401b, an insulating layer 402b, an oxide semiconductor layer 403b, an insulating layer 427, a conductive layer 405b, and a conductive layer 406b.

The conductive layer 401b is formed over a substrate 400b, the insulating layer 402b is formed over the conductive layer 401b, the oxide semiconductor layer 403b is formed over the conductive layer 401b with the insulating layer 402b interposed therebetween, the insulating layer 427 is formed over the conductive layer 401b with the insulating layer 402b and the oxide semiconductor layer 403b interposed therebetween, and the conductive layer 405b and the conductive layer 406b are formed over part of the oxide semiconductor layer 403b with the insulating layer 427 interposed therebetween. The conductive layer 401b can be provided so as to overlap with the whole oxide semiconductor layer 403b. When the conductive layer 401b overlaps with the whole oxide semiconductor layer 403b, light entering the oxide semiconductor layer 403b can be suppressed. The structure of the conductive layer 401b is not limited to this; the conductive layer 401b can be provided so as to overlap with part of the oxide semiconductor layer 403b.

Further, a protective insulating layer 409b is in contact with a top part of the transistor illustrated in FIG. 5B.

Figure 5C:
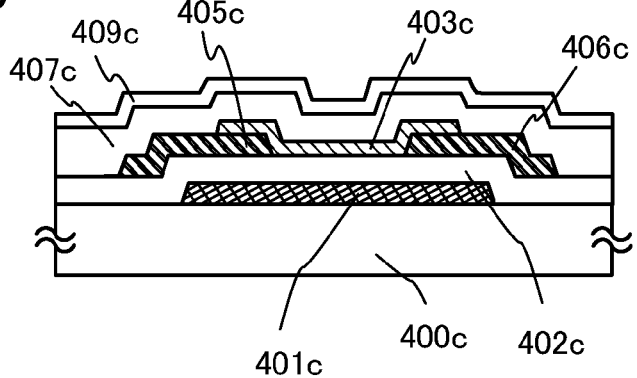

A transistor illustrated in FIG. 5C is one of bottom-gate transistors.

The transistor illustrated in FIG. 5C includes a conductive layer 401c, an insulating layer 402c, an oxide semiconductor layer 403c, a conductive layer 405c, and a conductive layer 406c.

The conductive layer 401c is formed over a substrate 400c, the insulating layer 402c is formed over the conductive layer 401c, the conductive layer 405c and the conductive layer 406c are formed over part of the insulating layer 402c, and the oxide semiconductor layer 403c is formed over the conductive layer 401c with the insulating layer 402c, the conductive layer 405c, and the conductive layer 406c interposed therebetween. The conductive layer 401c can be provided so as to overlap with the whole oxide semiconductor layer 403c. When the conductive layer 401c overlaps with the whole oxide semiconductor layer 403c, light entering the oxide semiconductor layer 403c can be suppressed. The structure of the conductive layer 401c is not limited to this; the conductive layer 401c can be provided so as to overlap with part of the oxide semiconductor layer 403c.

Further, in FIG. 5C, an oxide insulating layer 407c is in contact with an upper surface and a side surface of the oxide semiconductor layer 403c of the transistor. In addition, a protective insulating layer 409c is provided over the oxide insulating layer 407c.

Figure 5D:
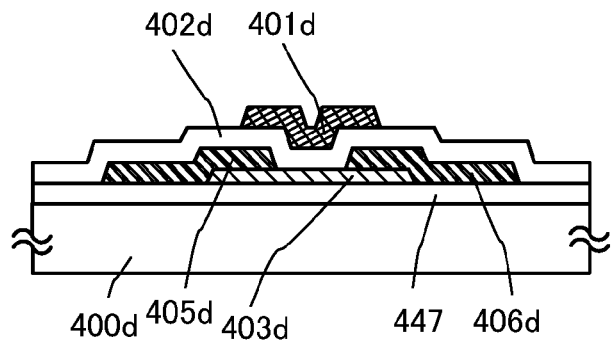

A transistor illustrated in FIG. 5D is one of top-gate transistors.

The transistor illustrated in FIG. 5D includes a conductive layer 401d, an insulating layer 402d, an oxide semiconductor layer 403d, a conductive layer 405d, and a conductive layer 406d.

The oxide semiconductor layer 403d is formed over a substrate 400d with an insulating layer 447 interposed therebetween, the conductive layer 405d and the conductive layer 406d are each formed over part of the oxide semiconductor layer 403d, the insulating layer 402d is formed over the oxide semiconductor layer 403d, the conductive layer 405d, and the conductive layer 406d, and the conductive layer 401d is formed over the oxide semiconductor layer 403d with the insulating layer 402d interposed therebetween.

As the substrates 400a to 400d, a glass substrate of barium borosilicate glass, aluminoborosilicate glass, or the like can be used, for example.

Alternatively, each of the substrates 400a to 400d can be a substrate of an insulator, such as a ceramic substrate, a quartz substrate, or a sapphire substrate. Further alternatively, crystallized glass can be used as the substrates 400a to 400d. Further alternatively, a plastic substrate can be used for the substrates 400a to 400d. Still further alternatively, a semiconductor substrate of silicon or the like can be used as the substrates 400a to 400d.

The insulating layer 447 serves as a base layer preventing diffusion of an impurity element from the substrate 400d. The insulating layer 447 can be, for example, a silicon nitride layer, a silicon oxide layer, a silicon nitride oxide layer, a silicon oxynitride layer, an aluminum oxide layer, or an aluminum oxynitride layer. Alternatively, the insulating layer 447 can be a stack of layers each using any of the materials applicable to the insulating layer 447. Alternatively, the insulating layer 447 can be a stack of a layer using a light-blocking material and a layer using any of the above materials applicable to the insulating layer 447. When the insulating layer 447 is formed using a layer using a light-blocking material, light entering the oxide semiconductor layer 403d can be suppressed.

Note that in the transistors illustrated in FIGS. 5A to 5C, an insulating layer may be provided between the substrate and the conductive layer serving as a gate electrode, as in the transistor illustrated in FIG. 5D.

Each of the conductive layers 401a to 401d functions as a gate electrode of the transistor. As the conductive layers 401a to 401d, it is possible to use, for example, a layer of a metal material such as molybdenum, titanium, chromium, tantalum, tungsten, aluminum, copper, neodymium, or scandium or an alloy material containing any of these materials as a main component. The conductive layers 401a to 401d can also be formed by stacking layers of materials which can be applied to the conductive layers 401a to 401d.

Each of the insulating layers 402a to 402d functions as a gate insulating layer of the transistor. As the insulating layers 402a to 402d, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layers 402a to 402d can also be formed by stacking layers of materials which can be applied to the insulating layers 402a to 402d. The layers of materials which can be applied to the insulating layers 402a to 402d can be formed by plasma CVD, sputtering, or the like. For example, the insulating layers 402a to 402d can be formed in the following manner: a silicon nitride layer is formed by plasma CVD, and a silicon oxide layer is formed over the silicon nitride layer by plasma CVD.

Each of the oxide semiconductor layers 403a to 403d functions as a channel formation layer of the transistor. As an oxide semiconductor which can be used for the oxide semiconductor layers 403a to 403d, for example, a four-component metal oxide, a three-component metal oxide, a two-component metal oxide, or the like can be given. As the four-component metal oxide, an In—Sn—Ga—Zn—O-based metal oxide or the like can be used, for example. As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be used, for example. Examples of the two-component metal oxide are an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Ga—O-based metal oxide, and an In—Sn—O-based metal oxide. In addition, an In—O-based metal oxide, a Sn—O-based metal oxide, a Zn—O-based metal oxide, or the like can also be used as the oxide semiconductor. The metal oxide that can be used as the oxide semiconductor may contain $SiO_2$.

In the case of using an In—Zn—O-based metal oxide, for example, an oxide target which has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio) can be used for formation. For example, in a target used for forming an In—Zn—O-based oxide semiconductor which has an atomic ratio of In:Zn:O=H:S:Z, the relation of Z>1.5H+S is satisfied. An increase in the amount of indium enables mobility of the transistor to increase.

As the oxide semiconductor, a material represented by $InMO_3(ZnO)_m$ (m is larger than 0) can be used. Here, M represents one or more metal elements selected from Ga, Al, Mn, and Co. For example, Ga, Ga and Al, Ga and Mn, Ga and Co, and the like can be given as M.

The conductive layers 405a to 405d and the conductive layers 406a to 406d function as a source electrode or a drain electrode of the transistors. As the conductive layers 405a to 405d and the conductive layers 406a to 406d, a layer of a metal material such as aluminum, chromium, copper, tantalum, titanium, molybdenum, or tungsten or an alloy material containing any of the metal materials as a main component may be used, for example. The conductive layers 405a to 405d and the conductive layers 406a to 406d can also be formed by stacking layers of materials which can be applied to the conductive layers 405a to 405d and the conductive layers 406a to 406d.

Each of the conductive layers 405a to 405d and the conductive layers 406a to 406d can be, for example, a stack of a metal layer of aluminum or copper and a high-melting-point metal layer of titanium, molybdenum, or tungsten. The conductive layers 405a to 405d and the conductive layers 406a to 406d may have a structure in which a metal layer of aluminum or copper is provided between a plurality of high-melting-point metal layers. Further, when the conductive layers 405a to 405d and the conductive layers 406a to 406d are formed using an aluminum layer to which an element that prevents generation of hillocks or whiskers (e.g., Si, Nd, or Sc) is added, heat resistance can be increased.

Alternatively, the conductive layers 405a to 405d and the conductive layers 406a to 406d may be formed using a layer containing a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or such a metal oxide material containing silicon oxide can be used, for example.

Furthermore, another wiring may be formed using the material used to form the conductive layers 405a to 405d and the conductive layers 406a to 406d.

The insulating layer 427 functions as a layer protecting a channel formation layer (also referred to as a channel protective layer) of the transistor, and as the insulating layer 427, a layer of a material applicable to the insulating layer 447 can be used, for example. The insulating layer 427 can also be formed by stacking layers of materials which can be applied to the insulating layer 427.

As the oxide insulating layer 407a and the oxide insulating layer 407c, an oxide insulating layer can be used and, for example, a silicon oxide layer or the like can be used. The oxide insulating layer 407a and the oxide insulating layer 407c can also be formed by stacking layers of materials which can be applied to the oxide insulating layer 407a and the oxide insulating layer 407c.

As the protective insulating layers 409a to 409c, an inorganic insulating layer such as a silicon nitride layer, an aluminum nitride layer, a silicon nitride oxide layer, or an aluminum nitride oxide layer can be used, for example. The protective insulating layers 409a to 409c can also be formed by stacking layers of materials which can be applied to the protective insulating layers 409a to 409c.

Next, as an example of a method for manufacturing the transistor in this embodiment, an example of a method for manufacturing the transistor illustrated in FIG. 5A will be described with reference to FIGS. 6A to 6C and FIGS. 7A and 7B. FIGS. 6A to 6C and FIGS. 7A and 7B are cross-sectional schematic views illustrating an example of the method for manufacturing the transistor illustrated in FIG. 5A.

First, the substrate 400a is prepared, and a first conductive film is formed over the substrate 400a.

As the first conductive film, a film of a metal material such as molybdenum, titanium, chromium, tantalum, tungsten, aluminum, copper, neodymium, or scandium, or an alloy material which contains any of the metal materials as a main component can be used. The first conductive film can also be formed by stacking layers of materials which can be applied to the first conductive film.

Next, a first photolithography process is carried out: a first resist mask is formed over the first conductive film, the first conductive film is selectively etched with use of the first resist mask to form the conductive layer 401a, and the first resist mask is removed.

In this embodiment, the resist mask may be formed by an inkjet method. Formation of the resist mask by an inkjet method needs no photomask; thus, manufacturing cost can be reduced.

In order to reduce the number of photomasks and steps in the photolithography process, etching may be performed using a resist mask formed by a multi-tone mask. A multi-tone mask is a mask through which light is transmitted to have a plurality of intensities. A resist mask formed using a multi-tone mask has a plurality of thicknesses and further can be changed in shape by being etched, and thus can be used in a plurality of etching steps to provide different patterns. Therefore, a resist mask corresponding to at least two kinds or more of different patterns can be formed by one multi-tone mask. Thus, the number of light-exposure masks can be reduced and the number of corresponding photolithography processes can also be reduced, whereby a manufacturing process can be simplified.

Next, the insulating layer 402a is formed over the conductive layer 401a.

For example, the insulating layer 402a can be formed by formation of an insulating film with a high-density plasma CVD method. For example, a high-density plasma CVD method using microwaves (e.g., microwaves with a frequency of 2.45 GHz) is preferable because an insulating film can be dense and have high withstand voltage and high quality. When a high-quality insulating layer is formed by formation of an insulating film with a high-density plasma CVD method, the interface state between the gate insulating layer and the channel formation layer of the transistor can be reduced, and thus favorable interface characteristics can be obtained.

The insulating layer 402a can also be formed by another method such as sputtering or plasma CVD. Further, heat treatment may be performed after the formation of the insulating layer 402a. The heat treatment can improve the quality of the insulating layer 402a and the interface characteristics between the insulating layer 402a and the oxide semiconductor.

Next, an oxide semiconductor film 530 having a thickness greater than or equal to 2 nm and less than or equal to 200 nm, preferably greater than or equal to 5 nm and less than or equal to 30 nm is formed over the insulating layer 402a. For example, the oxide semiconductor film 530 can be formed by a sputtering method.

Note that before the formation of the oxide semiconductor film 530, powdery substances (also referred to as particles or dust) attached on a surface of the insulating layer 402a are preferably removed by reverse sputtering in which an argon gas is introduced and plasma is generated. The reverse sputtering is a method in which voltage is applied to a substrate side with use of an RF power supply in an argon atmosphere without applying voltage to a target side and plasma is generated in the vicinity of the substrate so that a substrate surface is modified. Note that instead of an argon atmosphere, a nitrogen atmosphere, a helium atmosphere, an oxygen atmosphere, or the like may be used.

For example, the oxide semiconductor film 530 can be formed using an oxide semiconductor material which can be used as a material of the oxide semiconductor layer 403a. In this embodiment, the oxide semiconductor film 530 is formed, for example, by a sputtering method with use of an In—Ga—Zn—O-based oxide target. A cross-sectional schematic view at this stage corresponds to FIG. 6A. Further, the oxide semiconductor film 530 can be formed by a sputtering method in a rare gas (typically, argon) atmosphere, an oxygen atmosphere, or a mixed atmosphere of a rare gas and oxygen.

As a target for forming the oxide semiconductor film 530 by a sputtering method, for example, an oxide target having a composition ratio of $In_2O_3$:$Ga_2O_3$:ZnO=1:1:1 [molar ratio] can be used, for example. Without limitation to the above target, an oxide target having a composition ratio of $In_2O_3$:$Ga_2O_3$:ZnO=1:1:2 [molar ratio] may be used, for example. The proportion of the volume of the oxide target except for that of an area occupied by a space and the like in the total volume of the oxide target (also referred to as the filling rate) is greater than or equal to 90% and less than or equal to 100%, preferably greater than or equal to 95% and less than or equal to 99.9%. With use of a metal oxide target with high filling rate, the formed oxide semiconductor film has high density.

A sputtering gas used in the formation of the oxide semiconductor film 530 is preferably a high-purity gas from which an impurity such as hydrogen, water, a hydroxyl group, or a hydride is removed.

Before formation of the oxide semiconductor film 530, it is preferable that the substrate 400a over which the conductive layer 401a is formed or the substrate 400a over which the conductive layer 401a and the insulating layer 402a are formed be preheated in a preheating chamber in the sputtering apparatus, so that an impurity such as hydrogen or moisture adsorbed on the substrate 400a is eliminated and discharged. The heating in the preheating chamber can prevent hydrogen, a hydroxyl group, and moisture from entering the insulating layer 402a and the oxide semiconductor film 530. Note that a cryopump is preferable as an evacuation unit provided in the preheating chamber. The preheating treatment may be omitted. Further, after the steps up to and including formation of the conductive layer 405a and the conductive layer 406a are performed and before the oxide insulating layer 407a is formed, the preheating treatment may be performed on the substrate 400a in a similar manner.

When the oxide semiconductor film 530 is formed by a sputtering method, the substrate 400a is held inside a film formation chamber kept in a reduced pressure state, and the substrate temperature is set in the range of 100° C. to 600° C., preferably 200° C. to 400° C. By heating the substrate 400a, the concentration of an impurity contained in the oxide semiconductor film 530 to be formed can be reduced. Further, heating of the substrate 400a can reduce damage on the oxide semiconductor film 530 due to sputtering. Then, a sputtering gas from which hydrogen and moisture are removed is introduced while remaining moisture in the film formation chamber is removed, and the above-described target is used; thus, the oxide semiconductor film 530 is formed over the insulating layer 402a.

Note that in this embodiment, for example, an entrapment vacuum pump can be used as a means for removing moisture remaining in the film formation chamber in which sputtering is performed. As the entrapment vacuum pump, a cryopump, an ion pump, or a titanium sublimation pump can be used, for example. When a cryopump is used as an example, a compound including either or both a hydrogen atom or/and a carbon atom, or the like can be eliminated, and thus the concentration of an impurity included in a film formed in the film formation chamber can be reduced. Further, in this embodiment, a turbo pump provided with a cold trap may be used as a means for removing moisture remaining in the film formation chamber in which sputtering is performed.

As an example of the deposition condition of the oxide semiconductor film 530 with use of the sputtering apparatus, the following conditions are employed: the distance between the substrate and the target is 100 mm, the pressure is 0.6 Pa, the direct-current (DC) power is 0.5 kW, and the atmosphere is an oxygen atmosphere (the proportion of oxygen flow: 100%). Note that the use of a pulse direct-current power supply makes it possible to reduce powdery substances that occur at the time of film formation and make the film thickness uniform.

Next, a second photolithography process is carried out: a second resist mask is formed over the oxide semiconductor film 530, the oxide semiconductor film 530 is selectively etched with use of the second resist mask to process the oxide semiconductor film 530 into an island-shaped oxide semiconductor layer, and the second resist mask is removed.

In the case of forming a contact hole in the insulating layer 402a, the contact hole can be formed at the time of processing the oxide semiconductor film 530 into the island-shaped oxide semiconductor layer.

For example, dry etching, wet etching, or both dry etching and wet etching may be employed for etching the oxide semiconductor film 530. As an etchant used for wet etching, for example, a mixed solution of phosphoric acid, acetic acid, and nitric acid, or the like can be used. In addition, ITO07N (produced by Kanto Chemical Co., Inc.) may be used.

Next, the oxide semiconductor layer is subjected to first heat treatment. With the first heat treatment, dehydration or dehydrogenation of the oxide semiconductor layer can be conducted. The temperature of the first heat treatment is higher than or equal to 400° C. and lower than or equal to 750° C., preferably higher than or equal to 400° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour. After that, the oxide semiconductor layer is prevented from being exposed to the air and from containing water or hydrogen. Thus, the oxide semiconductor layer 403a is obtained (see FIG. 6B).

The heat treatment apparatus is not limited to the electric furnace and may be the one provided with a device for heating an object using heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with an object by heat treatment, such as nitrogen or a rare gas like argon, is used.

For example, as the first heat treatment, GRTA may be performed in the following manner. The substrate is transferred to an inert gas which has been heated to a high temperature of 650° C. to 700° C., heated for several minutes, and transferred from the heated inert gas.

Note that in the first heat treatment, it is preferable that water, hydrogen, or the like be not contained in nitrogen or a rare gas such as helium, neon, or argon. It is also preferable that nitrogen or a rare gas such as helium, neon, or argon introduced into the heat treatment apparatus have a purity of 6N (99.9999%) or more, preferably, 7N (99.99999%) or more (that is, the impurity concentration is set to be equal to or lower than 1 ppm, preferably, equal to or lower than 0.1 ppm).

After the oxide semiconductor layer is heated by the first heat treatment, a high-purity oxygen gas, a high-purity $N_2O$ gas, or ultra-dry air (having a dew point of −40° C. or lower, preferably −60° C. or lower) may be introduced into the furnace where the first heat treatment has been performed. It is preferable that the oxygen gas or the $N_2O$ gas do not contain water, hydrogen, and the like. The purity of the oxygen gas or the $N_2O$ gas which is introduced into the heat treatment apparatus is greater than or equal to 6N, preferably greater than or equal to 7N (i.e., the impurity concentration of the oxygen gas or the $N_2O$ gas is preferably lower than or equal to 1 ppm, further preferably lower than or equal to 0.1 ppm). By the effect of the oxygen gas or the $N_2O$ gas, oxygen that has been reduced through the step of eliminating an impurity by the dehydration or dehydrogenation treatment is supplied; thus, the oxide semiconductor layer 403a is highly purified.

The first heat treatment may also be performed on the oxide semiconductor film 530 before being processed into the island-shaped oxide semiconductor layer. In such a case, the substrate is taken out from the heating apparatus after the first heat treatment and then the oxide semiconductor film 530 is processed into the island-shaped oxide semiconductor layer.

In addition to the above-described timings, the first heat treatment may be performed after the conductive layer 405a and the conductive layer 406a are formed over the oxide semiconductor layer 403a or after the oxide insulating layer 407a is formed over the conductive layer 405a and the conductive layer 406a, as long as it is performed after the formation of the oxide semiconductor layer.

In the case of forming a contact hole in the insulating layer 402a, the contact hole may be formed before the first heat treatment is performed.

The oxide semiconductor layer may be formed using an oxide semiconductor film which is formed through two deposition steps and two heat treatments. By such a method, a film including a thick crystalline region (a single crystal region), that is, a region having crystal whose c-axis is aligned in a direction perpendicular to a surface of the film can be formed, regardless of the material of a base component such as an oxide, a nitride, or a metal. For example, a first oxide semiconductor film with a thickness greater than or equal to 3 nm and less than or equal to 15 nm is deposited and subjected to first heat treatment at a temperature higher than or equal to 450° C. and lower than or equal to 850° C., preferably higher than or equal to 550° C. and lower than or equal to 750° C. in an atmosphere of nitrogen, oxygen, a rare gas, or dry air, so that the first oxide semiconductor film which includes a crystalline region (including a plate-like crystal) in a region including a surface is formed. Then, a second oxide semiconductor film which is thicker than the first oxide semiconductor film is formed. Then, as a second heat treatment, a heat treatment at a temperature higher than or equal to 450° C. and lower than or equal to 850° C., preferably higher than or equal to 600° C. and lower than or equal to 700° C. is performed, so that a crystal of the first oxide semiconductor film is used as a seed of crystal growth and crystal growth upward from the first oxide semiconductor film to the second oxide semiconductor film is performed, whereby the whole of the second oxide semiconductor film is crystallized. In such a manner, the oxide semiconductor layer 403a may be formed using the oxide semiconductor film having a crystalline region with a large thickness.

Next, a second conductive film is formed over the insulating layer 402a and the oxide semiconductor layer 403a.

As the second conductive film, a film of a metal material such as aluminum, chromium, copper, tantalum, titanium, molybdenum, or tungsten, or an alloy material which contains any of the metal materials as a main component can be used, for example. The second conductive film can also be formed by stacking films which can be applied to the second conductive film.

Figure 6A:
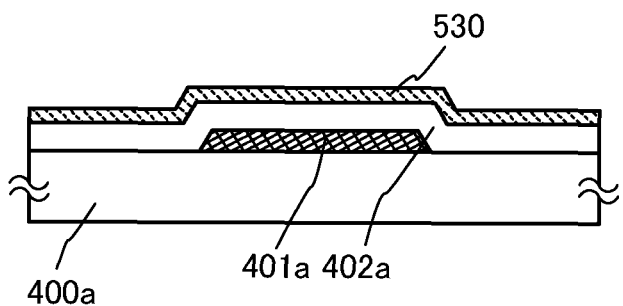
FIGS. 6A to 6C are cross-sectional schematic views illustrating a method for manufacturing a transistor according to Embodiment 4.
Figure 6B:
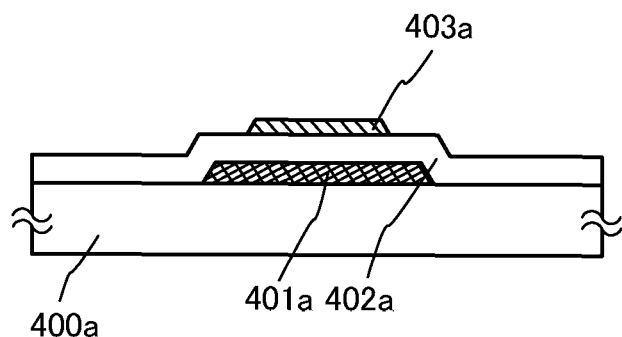
Figure 6C:
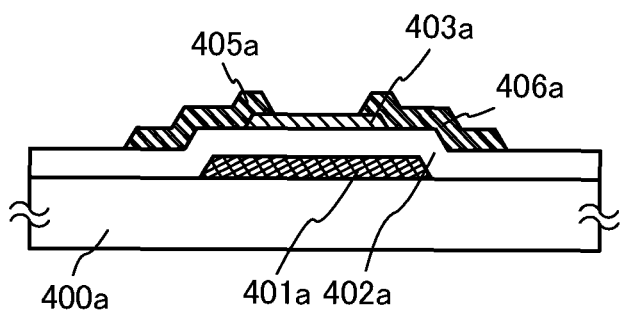

Next, a third photolithography process is carried out: a third resist mask is formed over the second conductive film, the second conductive film is selectively etched with use of the third resist mask to form the conductive layer 405a and the conductive layer 406a, and the third resist mask is removed (see FIG. 6C).

Note that another wiring may be formed using the second conductive film at the time of forming the conductive layer 405a and the conductive layer 406a.

In light exposure in forming the third resist mask, ultraviolet light, KrF laser light, or ArF laser light is preferably used. A channel length L of the transistor to be completed later depends on the width of an interval between a bottom end of the conductive layer 405a and a bottom end of the conductive layer 406a which are adjacent to each other over the oxide semiconductor layer 403a. In the case where light exposure is performed for formation of the third resist mask at the time when the channel length L is less than 25 nm, the light exposure may be performed using extreme ultraviolet light having an extremely short wavelength of several nanometers to several tens of nanometers. In the light exposure by extreme ultraviolet light, the resolution is high and the focus depth is large. Therefore, the channel length L of a transistor, which is formed later, can also be greater than or equal to 10 nm and less than or equal to 1000 nm. The use of such a transistor formed through the above-described light exposure enables the circuit to operate at a higher speed and, since the off-state current of the transistor is extremely low, to consume lower power.

In the case of etching the second conductive film, etching conditions are preferably optimized in order to prevent the oxide semiconductor layer 403a from being divided by the etching. However, it is difficult to set conditions under which only the second conductive film can be etched and the oxide semiconductor layer 403a is not etched at all. In some cases, part of the oxide semiconductor layer 403a is etched at the time of etching the second conductive film, so that the oxide semiconductor layer 403a in some cases include a groove portion (depression portion).

In this embodiment, a titanium film is used as an example of the second conductive film, an In—Ga—Zn—O-based oxide semiconductor is used as an example of the oxide semiconductor layer 403a, and an ammonia hydrogen peroxide solution (a mixture of ammonia, water, and a hydrogen peroxide solution) is used as an etchant.

Next, the oxide insulating layer 407a is formed over the oxide semiconductor layer 403a, the conductive layer 405a, and the conductive layer 406a. At this time, the oxide insulating layer 407a is in contact with part of the top surface of the oxide semiconductor layer 403a.

The oxide insulating layer 407a can be formed to a thickness of at least 1 nm or more using a method by which an impurity such as water or hydrogen is not introduced into the oxide insulating layer 407a, such as a sputtering method, as appropriate. When hydrogen is contained in the oxide insulating layer 407a, entry of the hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. Therefore, in order to form the oxide insulating layer 407a containing as little hydrogen as possible, it is preferable that a method in which hydrogen is not used be employed as a method for forming the oxide insulating layer 407a.

In this embodiment, a 200-nm-thick silicon oxide film is formed by a sputtering method as an example of the oxide insulating layer 407a. The substrate temperature at the time of the film formation may be higher than or equal to room temperature and lower than or equal to 300° C.; in this embodiment, the substrate temperature is 100° C. as an example. The formation of a silicon oxide film by a sputtering method can be performed in a rare gas (typically, argon) atmosphere, an oxygen atmosphere, or a mixed atmosphere of a rare gas and oxygen.

Further, a silicon oxide target or a silicon target can be used as a target for forming the oxide insulating layer 407a. For example, with use of a silicon target, a silicon oxide film can be formed by a sputtering method under an atmosphere containing oxygen.

As a sputtering gas used for forming the oxide semiconductor layer 407a, for example, a high-purity gas from which an impurity such as hydrogen, water, a hydroxyl group, or a hydride is removed is preferably used.

Before formation of the oxide insulating layer 407a, plasma treatment with use of a gas such as $N_2O$, $N_2$, or Ar may be performed to remove water or the like adsorbed on an exposed surface of the oxide semiconductor layer 403a. In the case where plasma treatment is performed, it is preferable that the oxide insulating layer 407a which is in contact with part of the upper surface of the oxide semiconductor layer 403a be formed without exposure to the air.

Then, second heat treatment can be performed (preferably, at a temperature higher than or equal to 200° C. and lower than or equal to 400° C., for example, higher than or equal to 250° C. and lower than or equal to 350° C.) in an inert gas atmosphere or in an oxygen gas atmosphere. For example, the second heat treatment is performed at 250° C. in a nitrogen atmosphere for one hour. By the second heat treatment, heat is applied while part of the top surface of the oxide semiconductor layer 403a is in contact with the oxide insulating layer 407a.

Through the above-described process, an impurity such as hydrogen, moisture, a hydroxyl group, or a hydride (also referred to as a hydrogen compound) can be intentionally removed from the oxide semiconductor layer, and in addition, oxygen can be supplied to the oxide semiconductor layer. Therefore, the oxide semiconductor layer is highly purified.

Figure 7A:
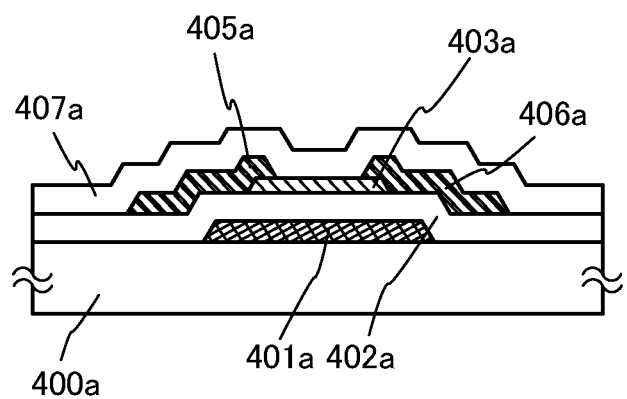
FIGS. 7A and 7B are cross-sectional schematic views illustrating a method for manufacturing a transistor according to Embodiment 4.
Figure 7B:
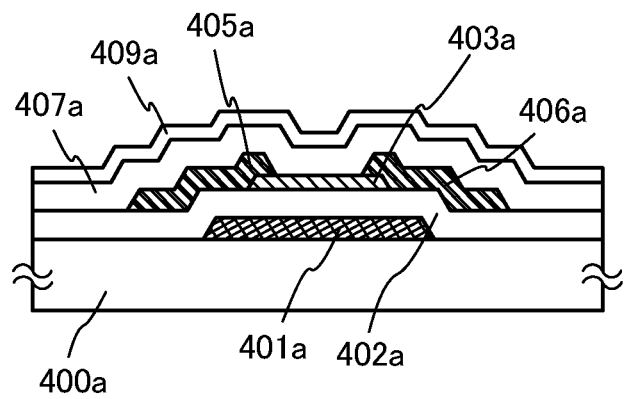

Through the above-described process, the transistor is formed (see FIG. 7A).

When a silicon oxide layer having many defects is used as the oxide insulating layer 407a, the heat treatment after formation of the silicon oxide layer has an effect of diffusing an impurity such as hydrogen, moisture, a hydroxyl group, or a hydride contained in the oxide semiconductor layer 403a to the oxide insulating layer 407a, so that the impurity contained in the oxide semiconductor layer 403a can be further reduced.

The protective insulating layer 409a may be further formed over the oxide insulating layer 407a. For example, a silicon nitride film is formed by an RF sputtering method. The RF sputtering is preferably used as a formation method of the protective insulating layer 409a because it achieves high mass productivity. In this embodiment, a silicon nitride film, for example, is formed to be the protective insulating layer 409a (see FIG. 7B).

In this embodiment, the protective insulating layer 409a is formed in such a manner that the substrate 400a over which the oxide insulating layer 407a has been formed as shown in FIG. 7A is heated at a temperature of 100° C. to 400° C., a sputtering gas containing high-purity nitrogen from which hydrogen and moisture are removed is introduced, and a silicon nitride film is formed with use of a target of a silicon semiconductor. In this case also, the protective insulating layer 409a is preferably formed while removing remaining moisture in the film formation chamber, in a manner similar to the case of the oxide insulating layer 407a.

After formation of the protective insulating layer 409a, heat treatment may be further performed in the air at a temperature higher than or equal to 100° C. and lower than or equal to 200° C. for more than or equal to one hour and less than or equal to 30 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal 200° C. and then decreased to room temperature. That is an example of the method for manufacturing the transistor illustrated in FIG. 5A.

The given example of the method for manufacturing transistor is not necessarily applied only to the transistor in FIG. 5A. For example as for the components of FIGS. 5B to 5D which have the same designations as the components of FIG. 5A and whose function is at least partly the same as that of the components of FIG. 5A, description of the example of the manufacturing method of the transistor illustrated in FIG. 5A can be referred to as appropriate.

As described above, the transistor in this embodiment includes an i-type or substantially i-type oxide semiconductor layer which is formed by highly purification and which includes a channel. By highly purification of the oxide semiconductor layer, the carrier concentration of the oxide semiconductor layer can be lower than $1 \times 10^{14}/cm^3$, preferably lower than $1 \times 10^{12}/cm^3$, further preferably lower than $1 \times 10^{11}/cm^3$, and thus, change in characteristics due to temperature change can be suppressed. With the above structure, the off-state current per micrometer of the channel width can be 10 aA ($1 \times 10^{-17}$ A) or less, 1 aA ($1 \times 10^{-18}$ A) or less, 10 zA ($1 \times 10^{-20}$ A) or less, further 1 zA ($1 \times 10^{-21}$ A) or less, and further more 100 yA ($1 \times 10^{-22}$ A) or less. It is preferable that the off-state current of the transistor be as low as possible. The lowest value of the off-state current of the transistor in this embodiment is estimated to be about $10^{-30}$ A/μm.

An example of calculation of the off-state current of the transistor in this embodiment by measuring the leakage current with use of a circuit for evaluating characteristics will be described.

Figure 8:
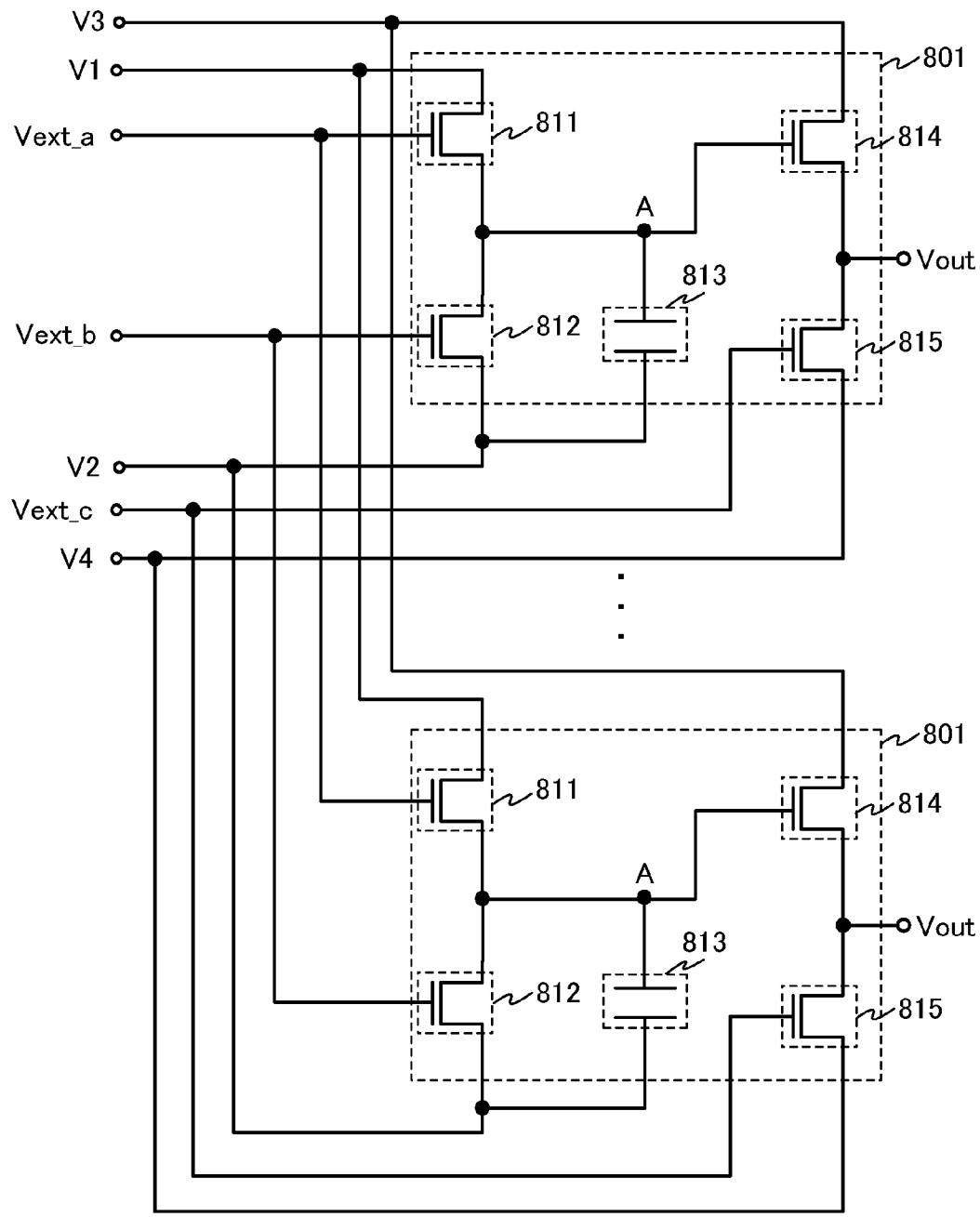
FIG. 8 is a circuit diagram showing a configuration of a circuit for evaluating characteristics.

First, a configuration of a circuit for evaluating characteristics is described with reference to FIG. 8. FIG. 8 is a circuit diagram showing a configuration of the circuit for evaluating characteristics.

The circuit for evaluating characteristics shown in FIG. 8 includes a plurality of measurement systems 801. The plurality of measurement systems 801 are connected in parallel. Here, as an example, eight measurement systems 801 are connected in parallel.

The measurement system 801 includes a transistor 811, a transistor 812, a capacitor 813, a transistor 814, and a transistor 815.

A voltage V1 is input to one of a source and a drain of the transistor 811, and a voltage Vext_a is input to a gate of the transistor 811. The transistor 811 is for injection of electric charge.

One of a source and a drain of the transistor 812 is electrically connected to the other of the source and the drain of the transistor 811, a voltage V2 is input to the other of the source and the drain of the transistor 812, and a voltage Vext_b is input to a gate of the transistor 812. The transistor 812 is for evaluation of leakage current. Note that the leakage current refers to leakage current including the off-state current of the transistor.

A first electrode of the capacitor 813 is connected to the other of the source and the drain of the transistor 811, and a voltage V2 is input to a second electrode of the capacitor 813. Here, 0 V is applied as the voltage V2.

A voltage V3 is input to one of a source and a drain of the transistor 814, and a gate of the transistor 814 is electrically connected to the one of the source and the drain of the transistor 811. Note that a portion where the gate of the transistor 814, the other of the source and the drain of the transistor 811, the one of the source and the drain of the transistor 812, and the first electrode of the capacitor 813 are connected to each other is referred to as a node A.

One of a source and a drain of the transistor 815 is electrically connected to the other of the source and the drain of the transistor 814, a voltage V4 is input to the other of the source and the drain of the transistor 815, and a voltage Vext_c is input to a gate of the transistor 815. Note that 0.5 V is applied as the voltage Vext_c as an example.

The measurement system 801 outputs a voltage at a portion where the other of the source and the drain of the transistor 814 is connected to the one of the source and the drain of the transistor 815, as an output voltage Vout.

Here, as an example of the transistor 811, a transistor including an oxide semiconductor layer and having a channel length L of 10 μm and a channel width W of 10 μm is used. As an example of each of the transistor 814 and the transistor 815, a transistor including an oxide semiconductor layer and having a channel length L of 3 μm and a channel width W of 100 μm is used. Further, as an example of the transistor 812, a transistor having a bottom gate structure which includes an oxide semiconductor layer is used. In the transistor as an example of the transistor 812, a source electrode and a drain electrode are in contact with an upper part of the oxide semiconductor layer, a region where the source and drain electrodes overlap with a gate electrode is not provided, and an offset region with a width of 1 μm is provided. Provision of the offset region enables parasitic capacitance to be reduced. Further, as the transistor 812, six types of transistors having different conditions, i.e., channel lengths L and channel widths W which are different from each other, are used (see Table 1).

TABLE 1

|  | Channel length L [μm] | Channel width W [μm] |
| --- | --- | --- |
| Condition 1 | 1.5 | $1 \times 10^5$ |
| Condition 2 | 3 | $1 \times 10^5$ |
| Condition 3 | 10 | $1 \times 10^5$ |
| Condition 4 | 1.5 | $1 \times 10^6$ |
| Condition 5 | 3 | $1 \times 10^6$ |
| Condition 6 | 10 | $1 \times 10^6$ |

The transistor for injection of electric charge and the transistor for evaluation of leakage current are separately provided as shown in FIG. 8, so that the transistor for evaluation of leakage current can be always kept off while electric charge is injected. In the case where the transistor for injection of electric charge is not provided, the transistor for evaluation of leakage current needs to be turned on when the electric charge is injected. In such a case, if an element requires a long time to change the transistor from an on state to the steady state of the off state, it takes a long time for measurement.

Further, the transistor for injection of electric charge and the transistor for evaluation of leakage current are separately provided, whereby each transistor can have an appropriate size. When the channel width W of the transistor for evaluation of leakage current is larger than the channel width W of the transistor for injection of electric charge, the leakage current components of the circuit for evaluating characteristics except for the transistor for evaluation of leakage current can be relatively reduced. As a result, the leakage current of the transistor for evaluation of leakage current can be measured with high accuracy. In addition, the transistor for evaluation of leakage current does not need to be once turned on when the electric charge is injected; thus, the node A has no influence of change in voltage which is caused by some of the charges in the channel formation region which flow into the node A.

On the other hand, the channel width W of the transistor for injection of electric charge is smaller than the channel width W of the transistor for evaluation of leakage current, whereby the leakage current of the transistor for injection of electric charge can be relatively reduced. In addition, the node A has less influence of change in voltage which is caused by some of the charges in the channel formation region which flows in the node A when electric charge is injected.

As shown in FIG. 8, the plurality of measurement systems are connected in parallel, whereby the leakage current of the circuit for evaluating characteristics can be calculated more accurately.

Next, a method for calculating a value of the off-state current of the transistor in this embodiment with use of the circuit for evaluating characteristics in FIG. 8 is described.

Figure 9:
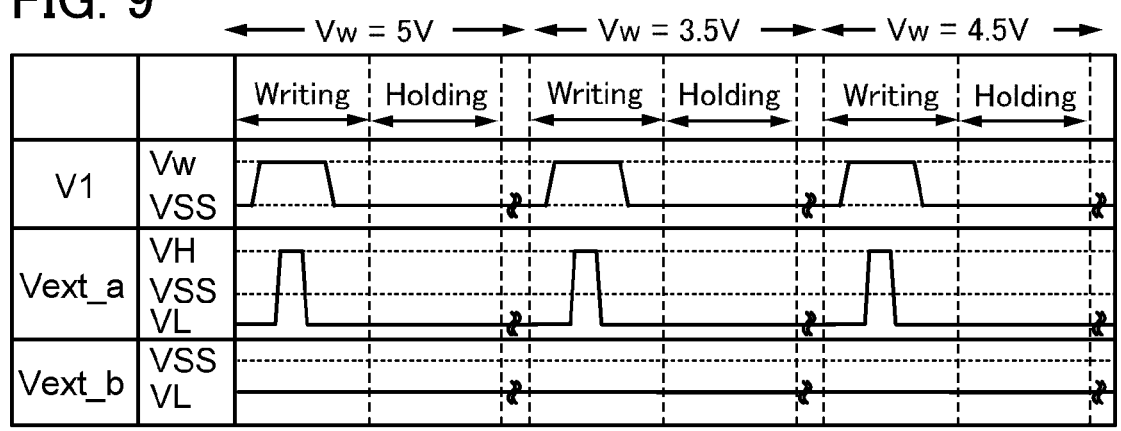
FIG. 9 is a timing chart for describing a method for measuring leakage current with use of the circuit for evaluating characteristics illustrated in FIG. 8.

First, a method for measuring a leakage current of the circuit for evaluating characteristics shown in FIG. 8 is described with reference to FIG. 9. FIG. 9 is a timing chart for describing the method for measuring the leakage current with use of the circuit for evaluating characteristics shown in FIG. 8.

In the measurement of the leakage current with use of the circuit for evaluating characteristics shown in FIG. 8, a writing period and the holding period are provided. The operation in each period is described below.

First, in the writing period, as the voltage Vext_b, the voltage VL (−3 V) with which the transistor 812 is turned off is input. As the voltage V1, the writing voltage Vw is input, and then, as the voltage Vext_a, the voltage VH (5 V) with which the transistor 811 is in an on state for a certain period is input. Thus, electric charge is accumulated in the node A, and the voltage of the node A becomes equivalent to the writing voltage Vw. Then, as the voltage Vext_a, a voltage VL with which the transistor 811 is turned off is input. Then, as the voltage V1, the voltage VSS (0 V) is input.

In the following holding period, the amount of change in the voltage of the node A, caused by change in the amount of electric charge accumulated in the node A, is measured. From the amount of change in the voltage, the value of the current flowing between the source electrode and the drain electrode of the transistor 812 can be calculated. Thus, the electric charge of the node A can be accumulated, and the amount of change in the voltage of the node A can be measured.

Accumulation of electric charge of the node A and measurement of the amount of change in the voltage of the node A (also referred to as the accumulation and measurement operation) are repeatedly performed. First, a first accumulation and measurement operation is repeated 15 times. In the first accumulation and measurement operation, a voltage of 5 V as the writing voltage Vw is input during the writing period, and retention for one hour is performed during the holding period. Next, a second accumulation and measurement operation is repeated twice. In the second accumulation and measurement operation, a voltage of 3.5 V as the writing voltage Vw is input during the writing period, and retention for 50 hours is performed during the holding period. Next, a third accumulation and measurement operation is performed once. In the third accumulation and measurement operation, a voltage of 4.5 V as the writing voltage Vw is input during the writing period, and retention for 10 hours is performed during the holding period. By repeating the accumulation and measurement operation, the measured current value can be confirmed to be the value in the steady state. In other words, the transient current (a current component which decreases over time after the measurement starts) can be removed from the current $I_A$ flowing in the node A. As a result, the leakage current can be measured with high accuracy.

In general, $V_A$ denoting the voltage of the node A can be measured as a function of the output voltage Vout and expressed by the following equation (1).

[FORMULA 1]

$$V_A = F(Vout) \quad (1)$$

Electric charge $Q_A$ of the node A can be expressed by the following equation (2) using the voltage $V_A$ of the node A, capacitance $C_A$ connected to the node A, and a constant (const). Here, the capacitance $C_A$ connected to the node A is the sum of capacitance of the capacitor 813 and the other capacitance.

[FORMULA 2]

$$Q_A = C_A V_A + \text{const} \quad (2)$$

Since current $I_A$ of the node A is the time derivative of charge flowing into the node A (or charge flowing from the node A), the current $I_A$ of the node A is expressed by the following equation (3).

[FORMULA 3]

$$I_A \equiv \frac{\Delta Q_A}{\Delta t} = \frac{C_A \cdot \Delta F(Vout)}{\Delta t} \quad (3)$$

Here, as an example, Δt is about 54000 sec. As the above, the current $I_A$ of the node A, which is leakage current can be calculated with the capacitance $C_A$ connected to the node A and the output voltage Vout, and the leakage current of the circuit for evaluating characteristics can be accordingly obtained.

Next, the results of measuring the output voltage by the measurement method using the above circuit for evaluating characteristics are shown, and the value of the leakage current of the circuit for evaluating characteristics, which is calculated from the measurement results, is shown.

Figure 10:
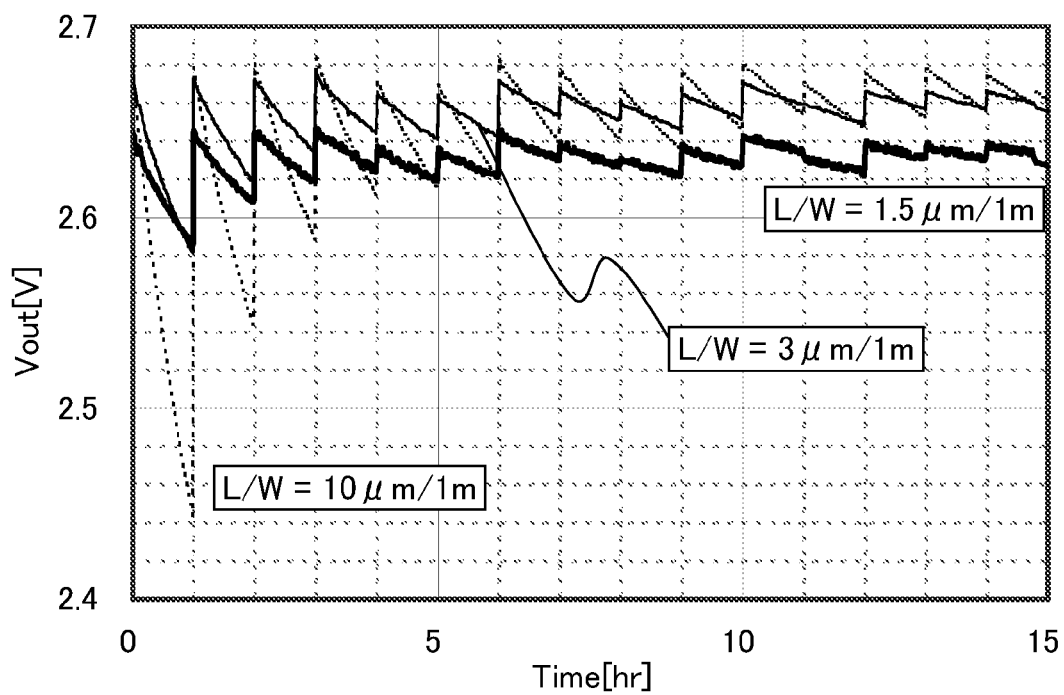
FIG. 10 is a graph showing a relation between output voltage $V_{out}$ and elapsed time Time in measurement under a condition 4, a condition 5, and a condition 6.
Figure 11:
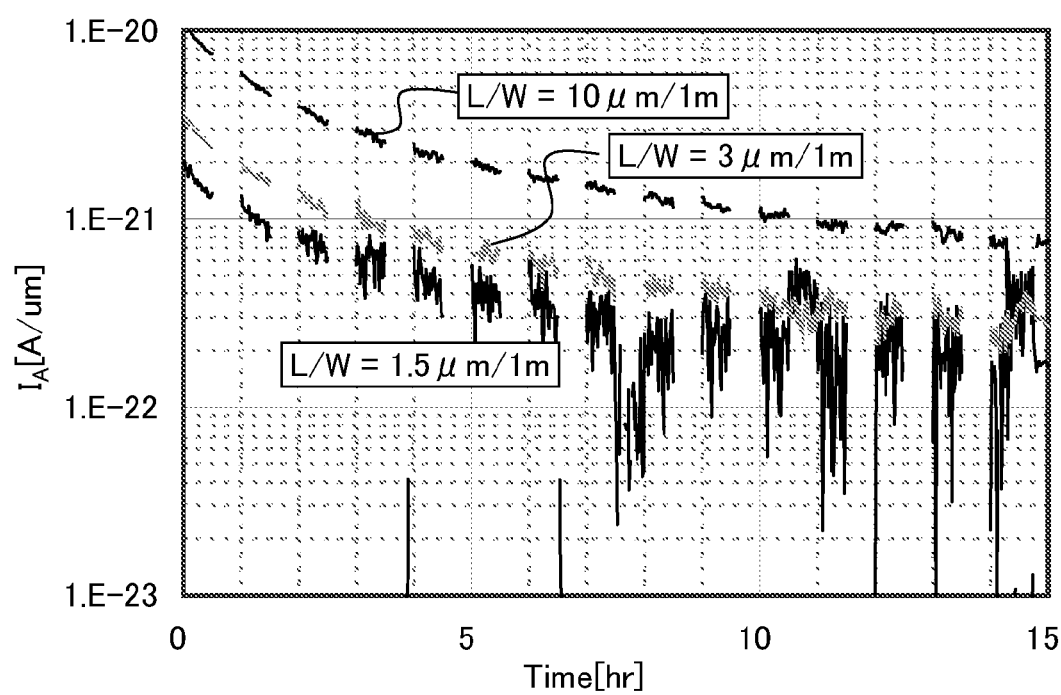
FIG. 11 is a graph showing a relation between leakage current calculated from measurement and elapsed time Time in the measurement.

FIG. 10 shows the relation between the output voltage Vout and the elapsed time Time in the measurement (the first accumulation and measurement operation) under a condition 4, a condition 5, and a condition 6. FIG. 11 shows the relation between the current $I_A$ calculated from the measurement and the elapsed time Time in the measurement. It is found that the output voltage Vout varies after the measurement starts and time required for obtaining the steady state is 10 hours or longer.

Figure 12:
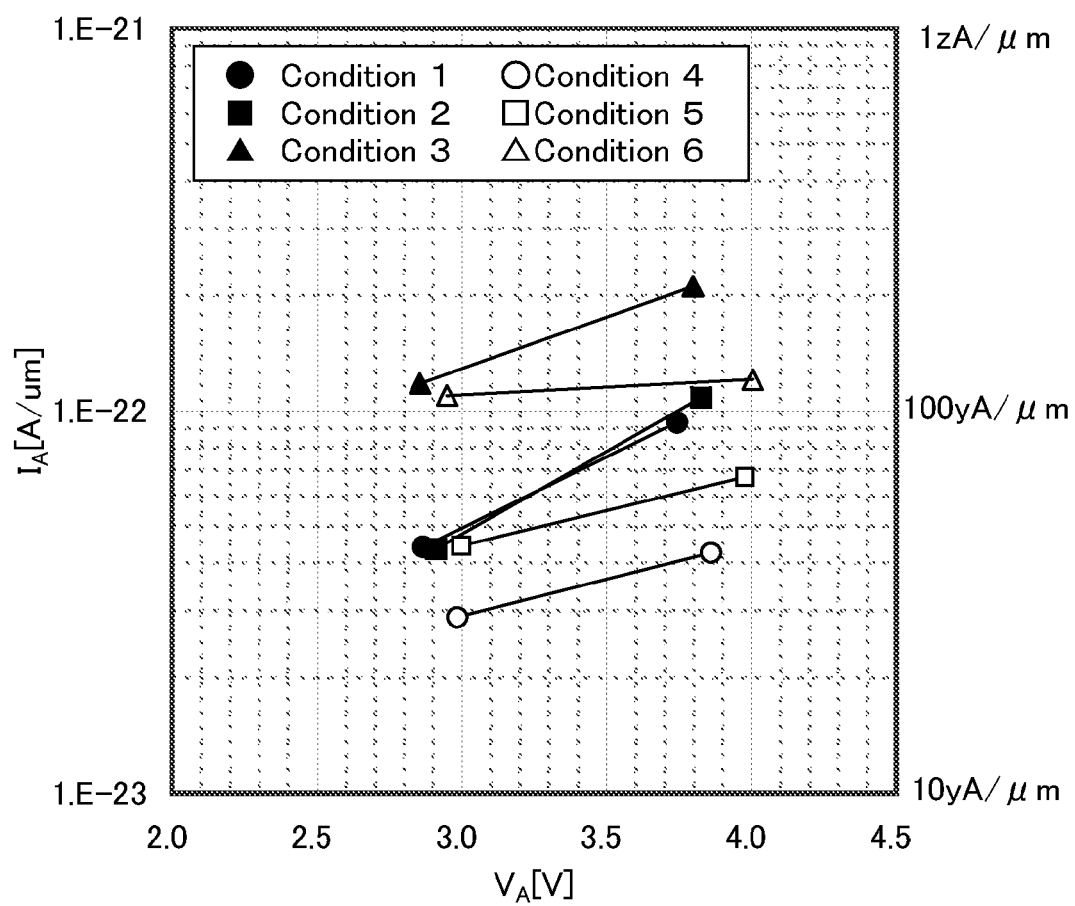
FIG. 12 is a graph showing a relation between leakage current and voltage of a node A estimated from measurement.

FIG. 12 shows the relation between the leakage current and the voltage of the node A under conditions 1 to 6 estimated from the measurement. According to FIG. 12, in a condition 4, for example, when the voltage of the node A is 3.0 V, the leakage current is 28 yA/μm. Since the leakage current includes the off-state current of the transistor 812, the off-state current of the transistor 812 can be considered to be 28 yA/μm or less.

Figure 13:
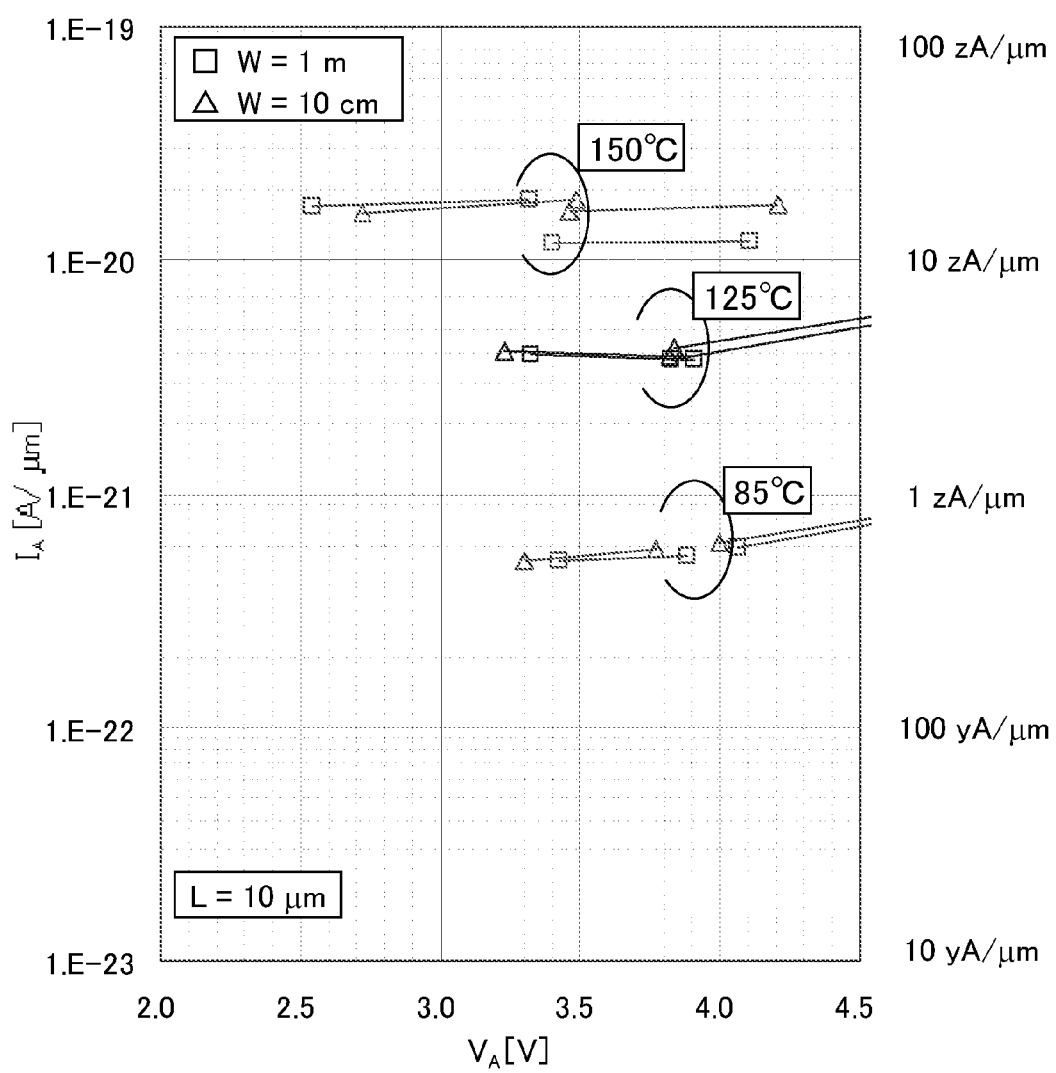
FIG. 13 is a graph showing a relation between leakage current and voltage of the node A estimated from measurement.
Figure 14:
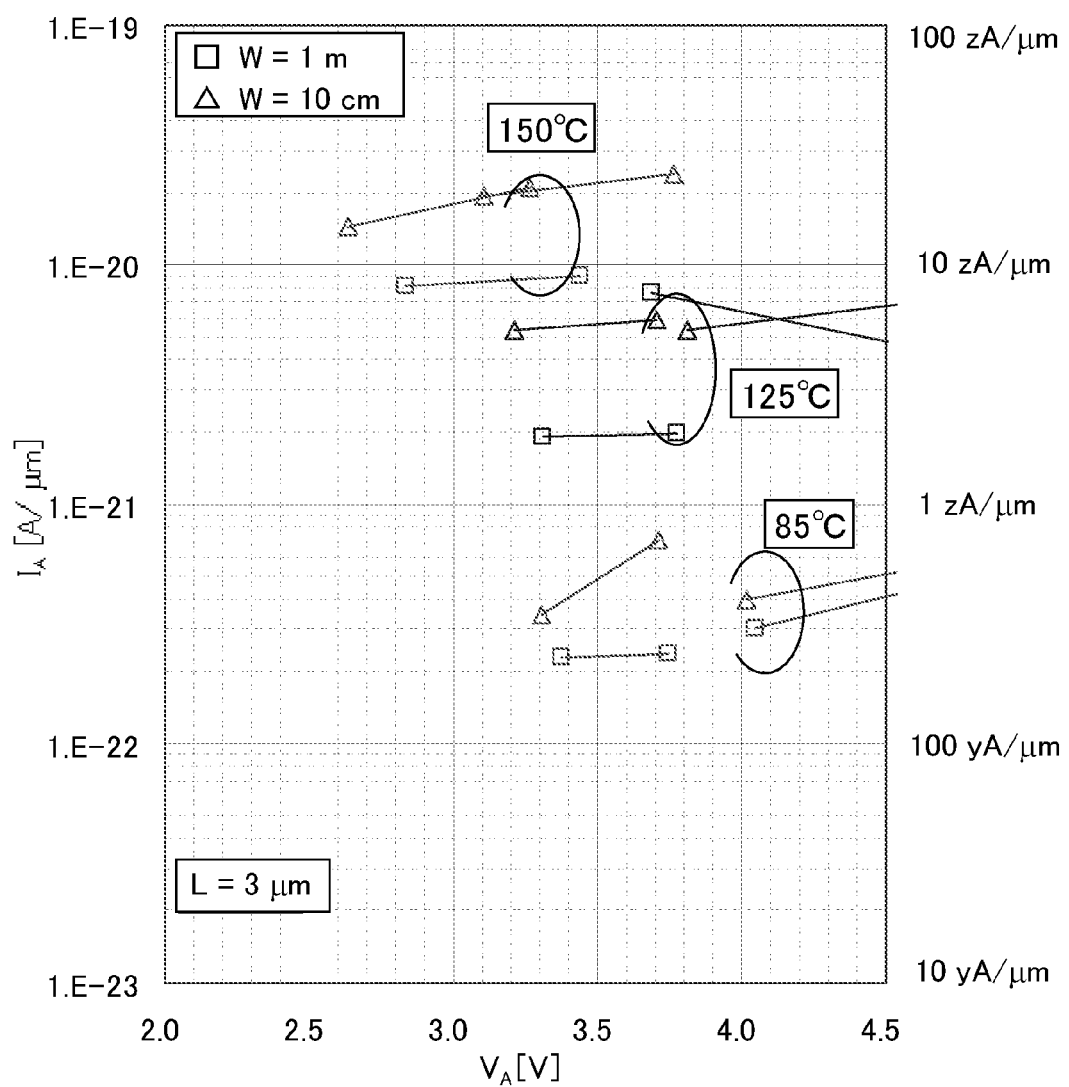
FIG. 14 is a graph showing a relation between leakage current and voltage of the node A estimated from measurement.
Figure 15:
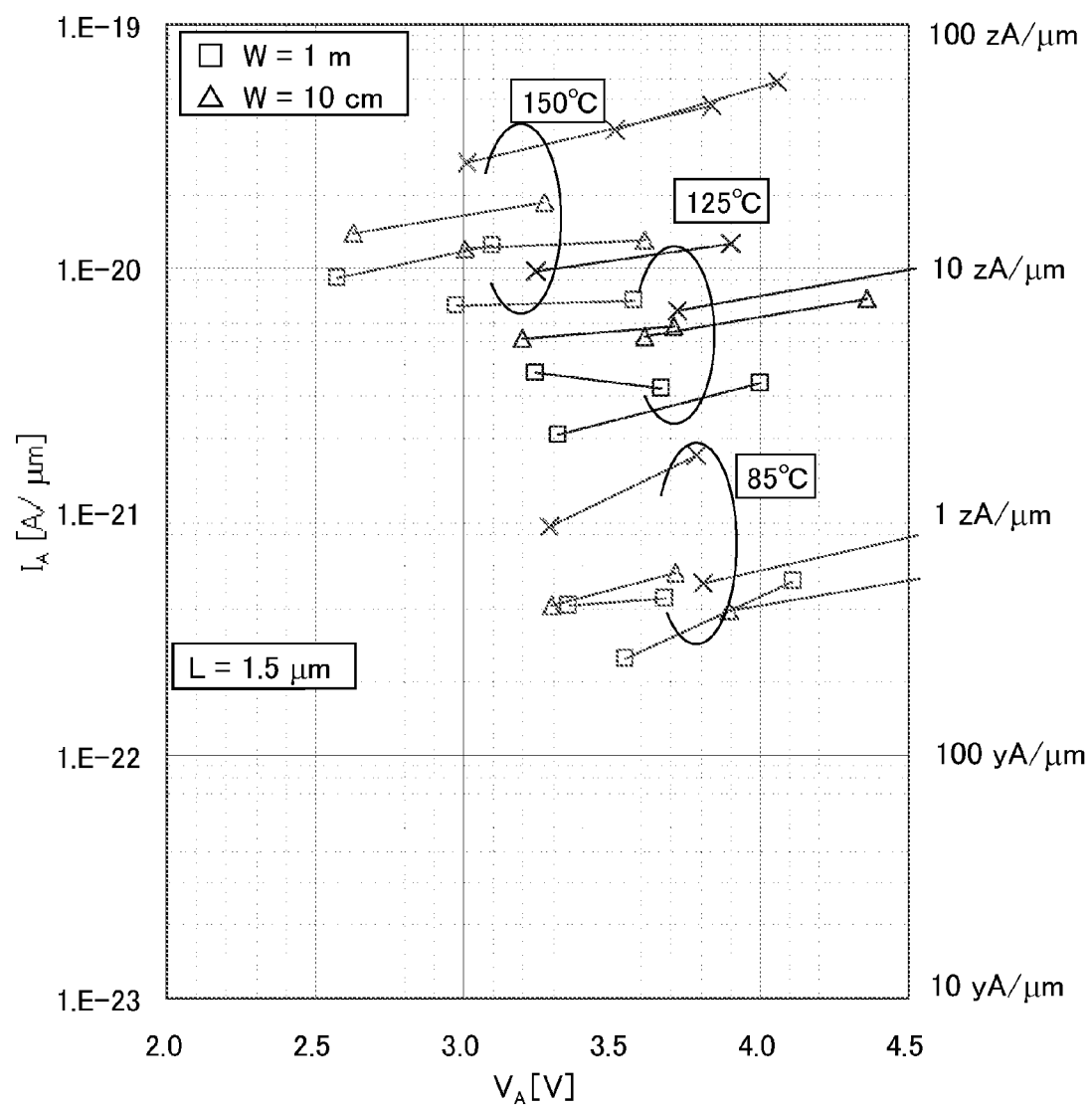
FIG. 15 is a graph showing a relation between leakage current and voltage of the node A estimated from measurement.

FIG. 13, FIG. 14, and FIG. 15 show the relation between the leakage current and the voltage of the node A under the conditions 1 to 6 estimated from the above measurement, at 85° C., 125° C., and 150° C. As shown in FIG. 13, FIG. 14, and FIG. 15, even in the case of 150° C., the leakage current is 100 zA/μm or less.

As described above, in the circuit for evaluating characteristics using a transistor which includes a highly purified oxide semiconductor layer having a function of a channel formation layer, the value of the leakage current is sufficiently low; thus, the off-state current of the transistor is significantly low. In addition, the off-state current of the above transistor is sufficiently low even when the temperature increases.

(Embodiment 5)

In this embodiment, an example of a structure of the unit pixel in the liquid crystal display device in the above embodiment will be described.

The unit pixel in this embodiment includes a first substrate (also referred to as an active matrix substrate) provided with a semiconductor element such as a transistor, a second substrate (also referred to as a counter substrate), and a liquid crystal layer provided between the active matrix substrate and the counter substrate.

Figure 16A:
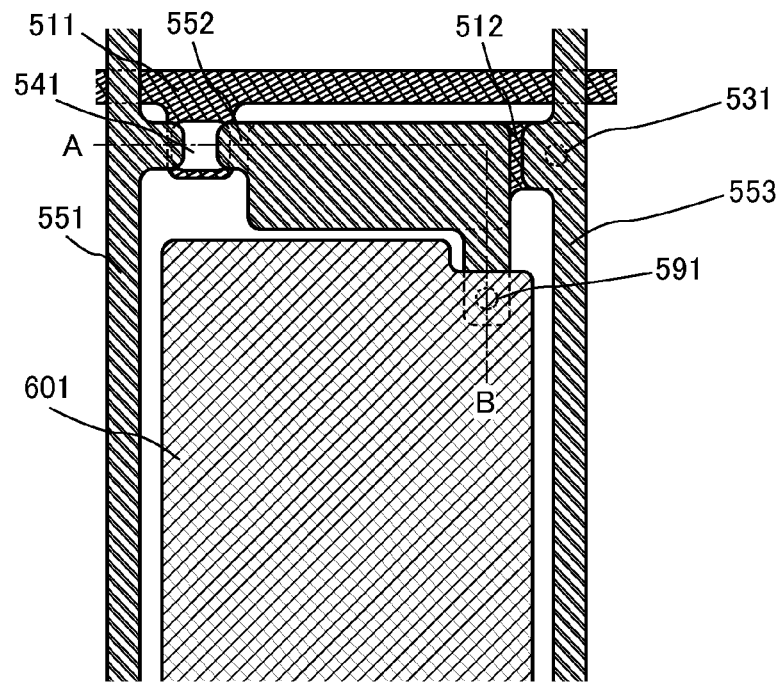
FIGS. 16A and 16B illustrate a structural example of an active matrix substrate in a unit pixel according to Embodiment 5.
Figure 16B:
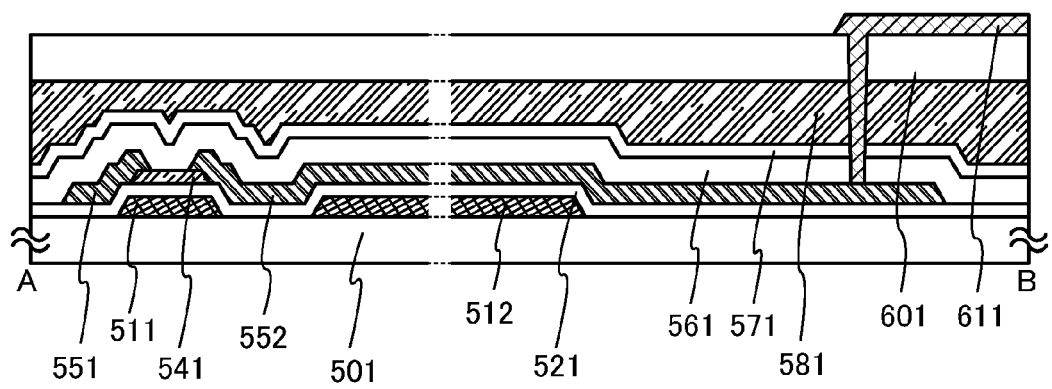

A structural example of the active matrix substrate in the unit pixel of this embodiment is described using FIGS. 16A and 16B. FIGS. 16A and 16B are schematic views illustrating a structural example of the active matrix substrate in the unit pixel in this embodiment. FIG. 16A is a plan schematic view, and FIG. 16B is a cross-sectional schematic view along line A-B in FIG. 16A. In FIGS. 16A and 16B, as an example of the transistor, the transistor having a structure described with reference to FIG. 5A in the above embodiment is shown.

The active matrix substrate illustrated in FIGS. 16A and 16B includes a substrate 501, a conductive layer 511, a conductive layer 512, an insulating layer 521, a semiconductor layer 541, a conductive layer 551, a conductive layer 552, a conductive layer 553, an oxide insulating layer 561, a protective insulating layer 571, a color filter layer 581, a planarization insulating layer 601, and a conductive layer 611.

The substrate 501 corresponds to the substrate 400a in FIG. 5A.

The conductive layer 511 and the conductive layer 512 are provided over one surface of the substrate 501. The conductive layer 511 functions as a selection signal line to which a selection signal SEL is input and corresponds to the conductive layer 401a in FIG. 5A. The conductive layer 512 functions as a first electrode of a capacitor.

The insulating layer 521 is provided over the one surface of the substrate 501 with the conductive layers 511 and 512 interposed therebetween. The insulating layer 521 corresponds to the insulating layer 402a in FIG. 5A and functions as a dielectric body of the capacitor.

The semiconductor layer 541 overlaps with the conductive layer 511 and is provided over the one surface of the substrate 501 with the conductive layer 511 and the insulating layer 521 interposed therebetween. The semiconductor layer 541 corresponds to the oxide semiconductor layer 403a in FIG. 5A.

The conductive layer 551 is electrically connected to the semiconductor layer 541 and functions as a pixel data signal line to which a pixel data signal PXD is input and corresponds to the conductive layer 405a in FIG. 5A.

The conductive layer 552 is electrically connected to the semiconductor layer 541. The conductive layer 552 overlaps with the conductive layer 512 with the insulating layer 521 interposed therebetween. The conductive layer 552 corresponds to the conductive layer 406a in FIG. 5A and functions as a second electrode of the capacitor.

The conductive layer 553 is electrically connected to the conductive layer 512 through a contact hole 531 provided in the insulating layer 521. The conductive layer 553 functions as a wiring through which the voltage is input. Note that the contact hole 531 is formed for example, as follows: after the insulating layer 521 is formed, a resist mask is formed by a photolithography process over the one surface of the substrate 501 with the conductive layer 512 and the insulating layer 521 interposed therebetween, and the insulating layer 521 is selectively etched with the resist mask. Note that the conductive layer 553 is not necessarily provided and can function as a wiring of the conductive layer 512.

The oxide insulating layer 561 is provided in contact with the semiconductor layer 541 and over the one surface of the substrate 501 with the conductive layer 511, the conductive layer 512, the insulating layer 521, the semiconductor layer 541, and the conductive layers 551 to 553 interposed therebetween. The oxide insulating layer 561 corresponds to the oxide insulating layer 407a in FIG. 5A.

The protective insulating layer 571 is stacked over the oxide insulating layer 561. The protective insulating layer 571 corresponds to the protective insulating layer 409a in FIG. 5A.

The color filter layer 581 is stacked over the protective insulating layer 571. The color filter layer 581 functions as a color filter. Note that in the case where a white unit pixel is provided in a pixel, the color filter layer 581 is not provided for the white unit pixel.

The planarization insulating layer 601 is stacked over the protective insulating layer 571 with the color filter layer 581 interposed therebetween.

The conductive layer 611 is provided over the planarization insulating layer 601 and electrically connected to the conductive layer 552 through the contact hole 591 provided in the planarization insulating layer 601, the color filter layer 581, the protective insulating layer 571, and the oxide insulating layer 561. The conductive layer 611 functions as a pixel electrode of a liquid crystal element.

Figure 17:
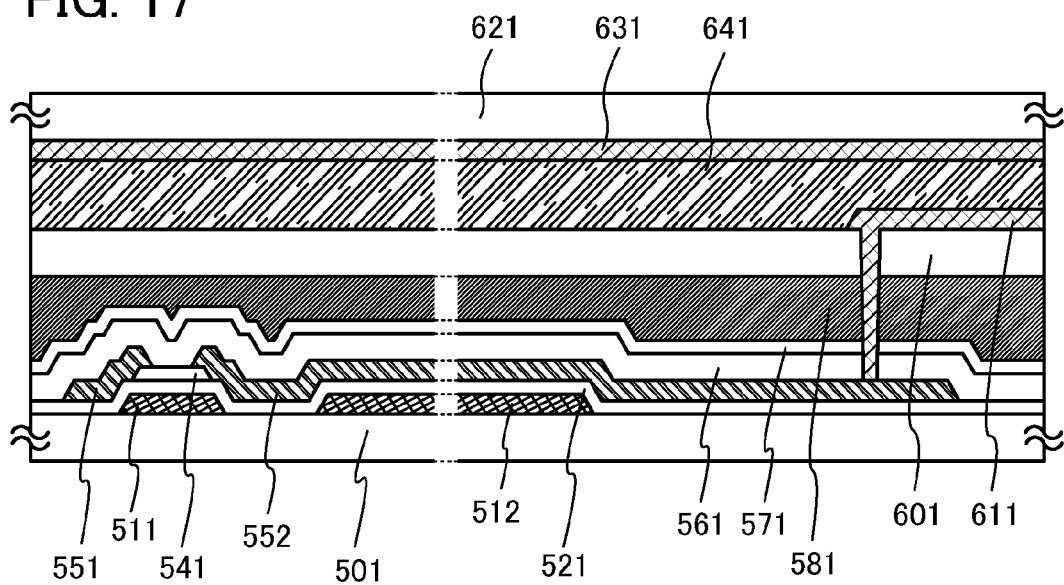
FIG. 17 is a structural example of a unit pixel according to Embodiment 5.

Further, a structural example of the unit pixel in this embodiment is described with reference to FIG. 17. FIG. 17 is a cross-sectional schematic view illustrating the structural example of the unit pixel in this embodiment.

The unit pixel illustrated in FIG. 17 includes a substrate 621, a conductive layer 631, and a liquid crystal layer 641 in addition to the active matrix substrate illustrated in FIGS. 16A and 16B.

The conductive layer 631 is provided for one surface of the substrate 621. The conductive layer 631 functions as a common electrode. Note that the color filter layer 581 may be provided between the substrate 621 and the conductive layer 631 instead of being provided over the one surface of the substrate 501 with the conductive layer 511, the conductive layer 512, the insulating layer 521, the semiconductor layer 541, the conductive layers 551 to 553, the oxide insulating layer 561, and the protective insulating layer 571 interposed therebetween. Further, the conductive layer 631 is not necessarily provided for the one surface of the substrate 621, and for example, may be provided over the one surface of the substrate 501 with the conductive layer 511, the conductive layer 512, the insulating layer 521, the semiconductor layer 541, the conductive layers 551 to 553, the oxide insulating layer 561, the protective insulating layer 571, and the planarization insulating layer 601 interposed therebetween.

The liquid crystal layer 641 is provided between the conductive layer 611 and the conductive layer 631. The liquid crystal layer 641 functions as liquid crystal including a liquid crystal molecule.

As each of the substrate 501 and the substrate 621, a substrate which can be applied to the substrate 400a in FIG. 5A can be used.

As each of the conductive layer 511 and the conductive layer 512, a layer whose material is applicable to the conductive layer 401a in FIG. 5A can be used. Alternatively, each of the conductive layer 511 and the conductive layer 512 may be formed by stacking layers whose materials are applicable to the conductive layer 401a.

As the insulating layer 521, a layer whose material is applicable to the insulating layer 402a in FIG. 5A can be used. Alternatively, the insulating layer 521 may be formed by stacking layers whose materials are applicable to the insulating layer 402a.

As the semiconductor layer 541, a layer whose material is applicable to the oxide semiconductor layer 403a in FIG. 5A can be used. Note that as the semiconductor layer 541, a semiconductor layer using a semiconductor (e.g., silicon) belonging to Group 14 may be used.

As each of the conductive layers 551 to 553, a layer whose material is applicable to the conductive layer 405a or the conductive layer 406a in FIG. 5A can be used. Alternatively, each of the conductive layers 551 to 553 may be formed by stacking layers whose materials are applicable to the conductive layer 405a or the conductive layer 406a.

As the oxide insulating layer 561, a layer whose material is applicable to the oxide insulating layer 407a in FIG. 5A can be used. Alternatively, the oxide insulating layer 561 may be formed by stacking layers whose materials are applicable to the oxide insulating layer 407a.

As the protective insulating layer 571, a layer whose material is applicable to the protective insulating layer 409a in FIG. 5A can be used. Alternatively, the protective insulating layer 571 may be formed by stacking layers applicable to the protective insulating layer 409a.

As the color filter layer 581, for example, a layer including a dye or a pigment can be used. In the case of using a dye, the color filter layer 581 is formed by a photolithography method, a printing method, or an inkjet method. In the case of using a pigment, the color filter layer 581 is formed by a photolithography method, a printing method, an electrodeposition method, an electrophotographic method, or the like. Here, the color filter layer is formed by an inkjet method. By using an inkjet method, the color filter layer can be formed at room temperature, can be formed at a low vacuum, or can be formed using a large substrate. Since the color filter layer can be formed without using a resist mask, manufacturing cost and the number of steps can be reduced. Further, since a film can be formed only in a portion where the film is needed, a material is not wasted as compared to a manufacturing method by which etching is performed after the film is formed over the entire surface, so that manufacturing cost can be reduced.

As the planarization insulating layer 601, a layer of an organic material such as polyimide, acrylic, or benzocyclobutene may be used. Alternatively, a layer of a low-dielectric constant material (a low-k material) can be used as the planarization insulating layer. The planarization insulating layer 601 can also be formed by stacking layers whose materials can be applied to the planarization insulating layer.

As each of the conductive layer 611 and the conductive layer 631, a layer of a light-transmitting conductive material such as indium tin oxide, a metal oxide in which zinc oxide is mixed in indium oxide (also referred to as indium zinc oxide (IZO)), a conductive material in which silicon oxide ($SiO_2$) is mixed in indium oxide, organoindium, organotin, indium oxide containing tungsten oxide, indium zinc oxide containing tungsten oxide, indium oxide containing titanium oxide, indium tin oxide containing titanium oxide, or the like can be used.

A conductive composition containing a conductive high molecule (also referred to as a conductive polymer) can be used for the conductive layer 611 and the conductive layer 631. A conductive layer formed using the conductive composition preferably has a sheet resistance of 10000 ohms or less per square and a transmittance of 70% or more at a wavelength of 550 nm. Furthermore, the resistivity of the conductive high molecule contained in the conductive composition is preferably less than or equal to 0.1 Ω·cm.

As the conductive high molecule, a so-called π-electron conjugated conductive polymer can be used. As the π-electron conjugated conductive polymer, polyaniline or a derivative thereof, polypyrrole or a derivative thereof, polythiophene or a derivative thereof, or a copolymer of two or more of aniline, pyrrole, and thiophene or a derivative thereof can be given.

For the liquid crystal layer 641, for example, a layer including TN liquid crystal, OCB liquid crystal, STN liquid crystal, VA liquid crystal, ECB liquid crystal, GH liquid crystal, polymer dispersed liquid crystal, or discotic liquid crystal can be used.

As described with reference to FIGS. 16A and 16B and FIG. 17, the unit pixel exemplified in this embodiment includes an active matrix substrate including a transistor and a pixel electrode, a counter substrate, and a liquid crystal layer including liquid crystal which is positioned between the counter substrate and the active matrix substrate. For example, with the above structure, the unit pixel of the liquid crystal display device in the above embodiment can be formed.

(Embodiment 6)

In this embodiment, an example of a backlight unit of the liquid crystal display device in Embodiment 1 will be described.

Figure 18A:
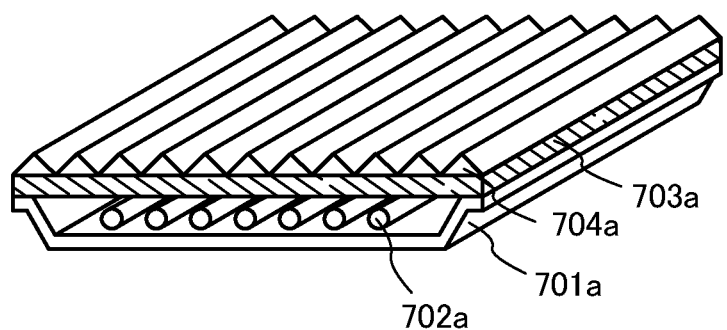
FIGS. 18A and 18B are schematic diagrams each illustrating a structural example of a backlight unit according to Embodiment 6.
Figure 18B:
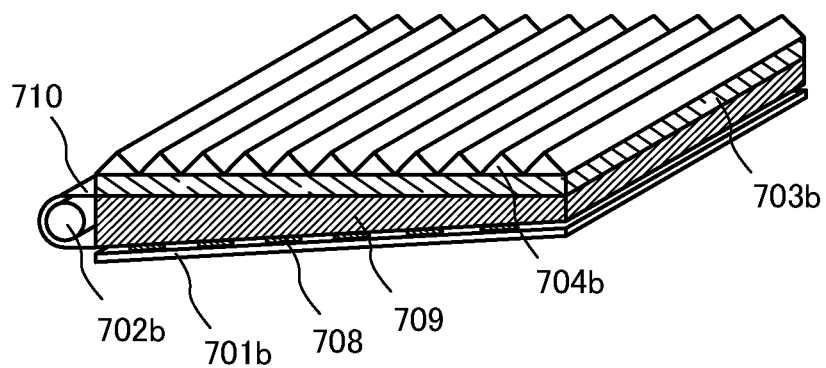

An example of a structure of a backlight unit in this embodiment is described with reference to FIGS. 18A and 18B. FIGS. 18A and 18B are schematic views illustrating structural examples of the backlight unit in this embodiment.

FIG. 18A is a schematic view illustrating a structural example of a direct-below-type backlight unit. The backlight unit illustrated in FIG. 18A includes a reflection plate 701*a*, a cold cathode fluorescent lamp 702*a*, a diffusion plate 703*a*, and a prism sheet 704*a*.

The cold cathode fluorescent lamp 702*a* is provided over one surface of the reflection plate 701*a* and sandwiched between the reflection plate 701*a* and the diffusion plate 703*a*. Note that a plurality of cold cathode fluorescent lamps 702*a* may be provided as illustrated in FIG. 18A.

The diffusion plate 703*a* is provided over the one surface of the reflection plate 701*a* with the cold cathode fluorescent lamp 702*a* therebetween.

The prism sheet 704*a* is provided over the one surface of the reflection plate 701*a* with the cold cathode fluorescent lamp 702*a* and the diffusion plate 703*a* interposed therebetween.

The backlight unit illustrated in FIG. 18A emits light from the cold cathode fluorescent lamp 702*a* through the diffusion plate 703*a* and the prism sheet 704*a*.

FIG. 18B is a schematic view illustrating a structural example of a side-light-type backlight unit. The backlight unit illustrated in FIG. 18B includes a reflection plate 701*b*, a cold cathode fluorescent lamp 702*b*, a diffusion plate 703*b*, a prism sheet 704*b*, a scattering pattern 708, a light guide plate 709, and a lamp reflector 710.

The cold cathode fluorescent lamp 702*b* is provided on a first side surface of the light guide plate 709. Note that the thickness of the light guide plate 709 is preferably reduced gradually from the first side surface toward a second surface facing the first side surface.

The diffusion plate 703*b* is provided over a first surface of the light guiding plate 709.

The prism sheet 704*b* is provided over the first surface of the light guiding plate 709 with the diffusion plate 703*b* interposed therebetween.

The scattering pattern 708 is provided on a second surface facing the first surface of the light guiding plate 709. Note that a plurality of scattering patterns 708 may be provided as illustrated in FIG. 18B.

The reflection plate 701*b* is provided on the second surface side of the light guiding plate 709 with the scattering pattern 708 interposed therebetween.

The lamp reflector 710 is provided for collecting light of the cold cathode fluorescent lamp 702*b*. With use of the lamp reflector 710, efficiency of light entering the light guiding plate 709 from the cold cathode fluorescent lamp 702*b* can be increased.

In the backlight unit illustrated in FIG. 18B, light from the cold cathode fluorescent lamp 702*b* is fully reflected by the light guiding plate 709 and scattered by the scattering pattern 708, so that light is emitted through the diffusion plate 703*b* and the prism sheet 704*b*.

The diffusion plate 703*a* and the diffusion plate 703*b* have a function of scattering incident light. With the diffusion plate 703*a* and the diffusion plate 703*b*, luminance of light emitted from the backlight unit can be uniform. A plurality of diffusion plates 703*a* and a plurality of diffusion plates 703*b* can be provided.

Further, the prism sheet 704*a* and the prism sheet 704*b* are not necessarily provided, but with the prism sheet 704*a* and the prism sheet 704*b*, luminescence of light emitted from the backlight unit can be increased. The prism sheet 704*a* and the prism sheet 704*b* can be formed by, for example, a process of etching a resin or the like. Note that the backlight unit in this embodiment may be provided with a plurality of prism sheets 704*a* and a plurality of prism sheets 704*b*.

As described with reference to FIGS. 18A and 18B, the backlight unit exemplified in this embodiment includes a cold cathode fluorescent lamp as a light source. With the above structure, light with high emission efficiency can be emitted to the pixel.

Further, light emitted from the backlight unit of this embodiment enters the pixel, and the pixel transmits the light from the backlight unit with the determined transmittance, so that display can be performed on the pixel.

(Embodiment 7)

In this embodiment, an electronic device provided with the liquid crystal display device of the above embodiment will be described.

Examples of structures of electronic devices in this embodiment will be described with reference to FIGS. 19A to 19F. FIGS. 19A to 19F are diagrams each illustrating an example of a structure of an electronic device of this embodiment.

Figure 19A:
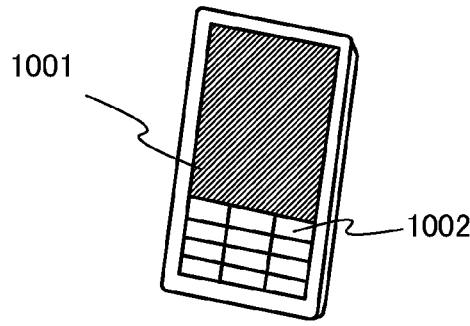
FIGS. 19A to 19F are schematic views each illustrating an example of an electronic device according to Embodiment 7.

An electronic device illustrated in FIG. 19A is a personal digital assistant. The personal digital assistant illustrated in FIG. 19A includes at least a display portion 1001. Further, the liquid crystal display device described in the above embodiment can realize long intervals between writing operations since a display period by one pixel-data writing is long. Therefore, by using the liquid crystal display device described in the above embodiment for the display portion 1001, even in the case where a person views images on the display portion 1001 for a long period of time for example, the level of eye fatigue caused can be made lower.

Figure 19B:
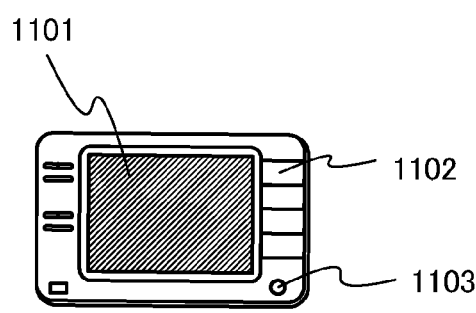

An electronic device illustrated in FIG. 19B is an information guide terminal including an automotive navigation system, for example. The information guide terminal illustrated in FIG. 19B includes at least a display portion 1101. The information guide terminal illustrated in FIG. 19B can also include operation buttons 1102 and an external input terminal 1103. The in-car temperature changes greatly in accordance with the outside-air temperature, and sometimes exceeds 50° C. Since characteristic change due to the temperature of the liquid crystal display device described in the above embodiment is small, the liquid crystal display device described in the above embodiment is used in the display portion 1101, so that the information guide terminal can be used under circumstances where the temperature greatly changes such as the inside of a car.

Figure 19C:
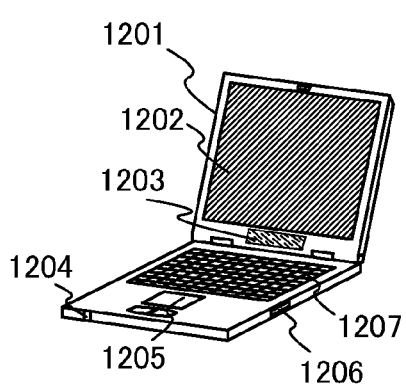

The electronic device illustrated in FIG. 19C is a laptop personal computer. The laptop personal computer illustrated in FIG. 19C includes a housing 1201, a display portion 1202, a speaker 1203, an LED lamp 1204, a pointing device 1205, a connection terminal 1206, and a keyboard 1207. Further, the liquid crystal display device described in the above embodiment can realize long intervals between writing operations since a display period by one pixel-data writing is long. Therefore, by using the liquid crystal display device described in the above embodiment for the display portion 1202, even in the case where a person views images on the display portion 1202 for a long period of time for example, the level of eye fatigue caused can be made lower.

Figure 19D:
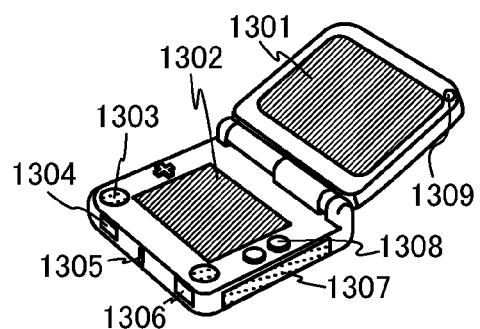

An electronic device illustrated in FIG. 19D is a portable game machine. The portable game machine illustrated in FIG. 19D includes a display portion 1301, a display portion 1302, a speaker 1303, a connection terminal 1304, an LED lamp 1305, a microphone 1306, a recording medium reading portion 1307, operation buttons 1308, and a sensor 1309. Further, the liquid crystal display device described in the above embodiment can realize long intervals between writing operations since a display period by one pixel-data writing is long. Therefore, by using the liquid crystal display device described in the above embodiment for the display portion 1301 or the display portion 1302, even in the case where a person views images on the display portion 1301 or the display portion 1302 for a long period of time for example, the level of eye fatigue caused can be made lower.

Figure 19E:
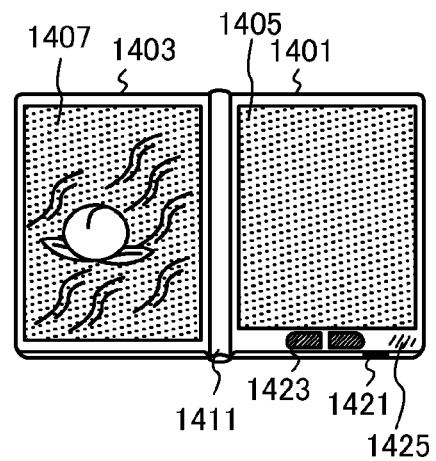

An electronic device illustrated in FIG. 19E is an electronic book reader (e-book reader). The e-book reader illustrated in FIG. 19E includes at least a housing 1401, a housing 1403, a display portion 1405, a display portion 1407, and a hinge 1411.

The housing 1401 and the housing 1403 are connected with the hinge 1411. The e-book reader illustrated in FIG. 19E can be opened and closed with the hinge 1411 as an axis. With such a structure, the e-book reader can be handled like a paper book. The display portion 1405 is incorporated in the housing 1401 and the display portion 1407 is incorporated in the housing 1403. The display portion 1405 and the display portion 1407 may display different images. For example, one image can be displayed across both the display portions. According to the structure where different images are displayed on the display portion 1405 and the display portion 1407, for example, the right display portion (the display portion 1405 in FIG. 19E) can display text and the left display portion (the display portion 1407 in FIG. 19E) can display an image.

In addition, the e-book reader illustrated in FIG. 19E may be provided with an operation portion or the like for the housing 1401 or the housing 1403. For example, the e-book reader illustrated in FIG. 19E may include a power switch 1421, operation keys 1423, and a speaker 1425. In the case of the e-book reader in FIG. 19E, pages of an image with a plurality of pages can be turned with the operation keys 1423. Further, the e-book reader illustrated in FIG. 19E may be provided with a keyboard, a pointing device, or the like for the display portion 1405 and/or the display portion 1407. An external connection terminal (an earphone terminal, a USB terminal, a terminal connectable to a variety of cables such as an AC adapter or a USB cable, or the like), a recording medium insertion portion, or the like may be provided on the rear surface or the side surface of the housing 1401 and the housing 1403 of the e-book reader illustrated in FIG. 19E. Further, the e-book reader illustrated in FIG. 19E may have a function of an electronic dictionary.

The liquid crystal display device of the above embodiment may be mounted on the display portion 1405 and/or the display portion 1407. Further, the liquid crystal display device described in the above embodiment can realize long intervals between writing operations since a display period by one pixel-data writing is long. Therefore, by using the liquid crystal display device in the above embodiment for the display portion 1405 and/or 1407, even in the case a person views images on the display portion 1405 or the display portion 1407 for a long period of time for example, the level of eye fatigue caused can be made lower.

The e-book reader illustrated in FIG. 19E may be capable of transmitting and receiving data by wireless communication. With such a configuration, desired book data or the like can be purchased and downloaded from an electronic book server.

Figure 19F:
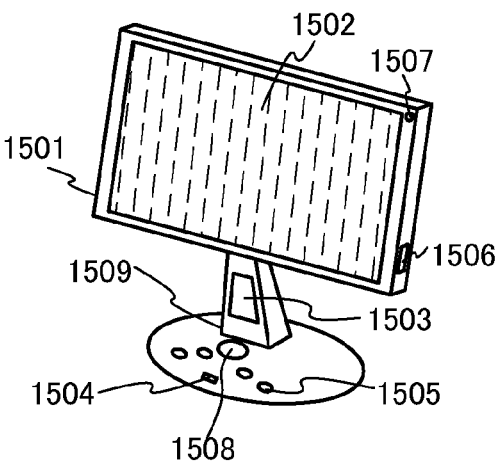

An electronic device illustrated in FIG. 19F is a display. The display illustrated in FIG. 19F includes a housing 1501, a display portion 1502, a speaker 1503, an LED lamp 1504, operation buttons 1505, a connection terminal 1506, a sensor 1507, a microphone 1508, and a support base 1509. Further, the liquid crystal display device described in the above embodiment can realize long intervals between writing operations since a display period by one pixel-data writing is long. Therefore, by using the liquid crystal display device described in the above embodiment for the display portion 1502, even in the case where a person views images on the display portion 1502 for a long period of time for example, the level of eye fatigue caused can be made lower.

Figure 20:
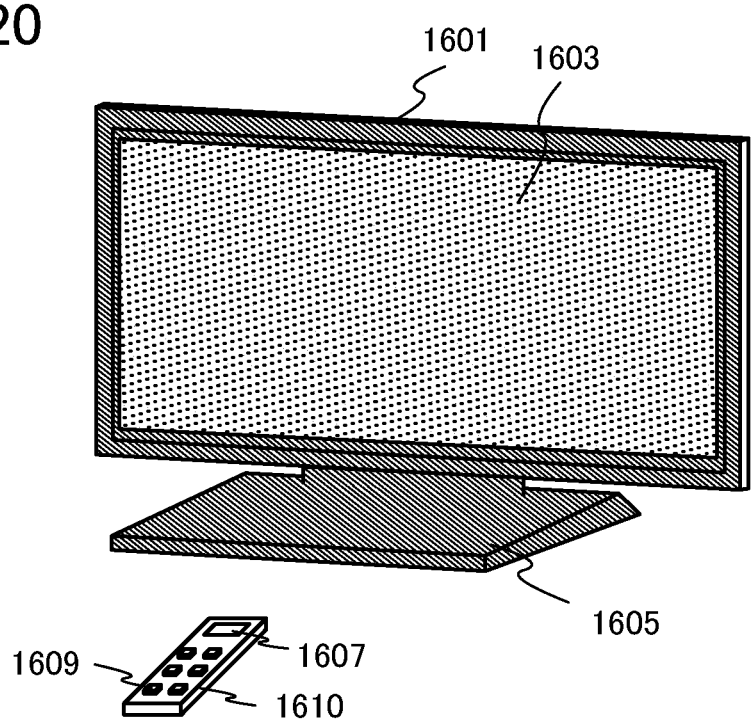
FIG. 20 is a schematic diagram illustrating an example of an electronic device according to Embodiment 7.

An electronic device illustrated in FIG. 20 is a television device. The television device illustrated in FIG. 20 includes a housing 1601 and a display portion 1603. The display portion 1603 is incorporated in the housing 1601. The television device illustrated in FIG. 20 can display an image on the display portion 1603. The housing 1601 in the television device illustrated in FIG. 20 is supported by a stand 1605, which is an example. Further, the liquid crystal display device described in the above embodiment can realize long intervals between writing operations since a display period by one pixel-data writing is long. Therefore, by using the liquid crystal display device described in the above embodiment for the display portion 1603, even in the case where a person views images on the display portion 1603 for a long period of time for example, the level of eye fatigue caused can be made lower.

The television device in FIG. 20 can be operated by an operation switch provided for the housing 1601 or a separate remote controller 1610 as illustrated in FIG. 20. With an operational key 1609 of the remote controller 1610, the channel and volume of the television device illustrated in FIG. 20 can be controlled, so that an image displayed on the display portion 1603 can be controlled. A display portion 1607 for displaying data outputted from the remote controller 1610 may be provided for the remote controller 1610.

Note that the television device illustrated in FIG. 20 is provided with a receiver, a modem, and the like. With the use of the receiver, general television broadcasting can be received. In addition, the television device can be connected to a communication network by wired or wireless connection via the modem, thereby performing one-way (from sender to receiver) or two-way (between sender and receiver, between receivers, or the like) data communication.

The electronic device of this embodiment may have a power source including a solar battery cell, a power storage for charging voltage that is output from the solar battery cell, and a DC converter for converting a voltage charged in the power storage into respective voltages appropriate for circuits. Consequently, an external power supply is not needed, and the electronic device can be used for a long period of time even at a place with no external power supply, so that the convenience of the electronic device can be improved.

In the electronic device of this embodiment, a display portion may have a touch panel function. The touch panel function can be added by mounting a touch panel unit on the display portion or by providing a photodetector circuit for a pixel.

By applying the liquid crystal display device described in the above embodiment to display portions of electronic devices as described with reference to FIGS. 19A to 19F and FIG. 20, electronic devices with low power consumption can be provided.

This application is based on Japanese Patent Application serial no. 2010-104441 filed with Japan Patent Office on Apr. 28, 2010, the entire contents of which are hereby incorporated by reference.

What is claimed is:

1. A liquid crystal display device comprising:
   a pixel portion;
   a display control circuit;
   a selection signal output circuit;
   a pixel data signal output circuit configured to be supplied with an image signal for displaying an image, generate a pixel data signal in accordance with the inputted image signal, and output the pixel data signal; and
   a backlight unit including a cold cathode fluorescent lamp as a light source and configured to emit light to the pixel portion,
   wherein the liquid crystal display device is configured to be driven in a first operation mode and a second operation mode performed after the first operation mode,
   wherein the display control circuit is configured to control the selection signal output circuit and the pixel data signal output circuit in accordance with a control signal to switch the first operation mode and the second operation mode,
   wherein the pixel portion comprises:
     a transistor including a source electrode, a drain electrode, an oxide semiconductor layer including a channel formation region, and a gate electrode;
     a first electrode electrically connected to the other of the source electrode and the drain electrode of the transistor;
     a second electrode; and
     a liquid crystal to which a voltage is applied through the first electrode and the second electrode,
   wherein the selection signal output circuit is configured to supply a selection signal to the gate electrode of the transistor so that the transistor turns on, in the first operation mode,
   wherein the pixel data signal output circuit is configured to supply the pixel data signal to the first electrode through the transistor in the first operation mode,
   wherein the display control circuit is configured to sequentially stop supply of a start signal, a clock signal and power supply voltage to the selection signal output circuit and the pixel data signal output circuit in this order to stop operations of the selection signal output circuit and the pixel data signal output circuit in the second operation mode,
   wherein the transistor is configured to remain off during the second operation mode, and
   wherein the pixel portion is configured to hold the pixel data signal so that the image in accordance with the image signal is displayed during the second operation mode.

2. The liquid crystal display device according to claim 1, wherein the oxide semiconductor layer has a carrier concentration lower than $1 \times 10^{14}$ /cm$^3$.

3. The liquid crystal display device according to claim 1, further comprising a control signal generation circuit comprising a memory circuit and a comparison circuit,
   wherein the control signal generation circuit is configured to generate the control signal in accordance with a difference between data of image signals in successive frame period stored in the memory circuit.

4. The liquid crystal display device according to claim 1, wherein the control signal is generated in accordance with input from a user with an input device.

5. The liquid crystal display device according to claim 1, wherein an off-state current of the transistor is less than or equal to 100 yA per micrometer of a channel width.

6. The liquid crystal display device according to claim 1, wherein the pixel portion is configured to hold the pixel data signal for 10 seconds or longer so that the image in accordance with the image signal is displayed during the second operation mode.

7. A liquid crystal display device comprising:
   a pixel portion;
   a display control circuit;
   a selection signal output circuit;
   a pixel data signal output circuit configured to be supplied with an image signal for displaying an image, generate Y (Y is a natural number) pixel data signals in accordance with the inputted image signal, and output the Y pixel data signals; and
   a backlight unit including a cold cathode fluorescent lamp as a light source and configured to emit light to the pixel portion, wherein the liquid crystal display device is configured to be driven in a first operation mode and a second operation mode performed after the first operation mode, wherein the display control circuit is configured to control the selection signal output circuit and the pixel data signal output circuit in accordance with a control signal to switch the first operation mode and the second operation mode, wherein the pixel portion comprises:
- N (N is a natural number greater than or equal to 3) transistors each including a source electrode, a drain electrode, a gate electrode and an oxide semiconductor layer including a channel formation region;
- N first electrodes electrically connected to respective electrodes each of which is the other of the source electrode and the drain electrode of each of the N transistors;
- a second electrode;
- a liquid crystal to which a voltage is applied through each of the N first electrodes and the second electrode; and
- K (K is a natural number greater than or equal to 3 and less than or equal to N) color filters overlapping with the respective first electrodes of the N first electrodes, wherein the selection signal output circuit is configured to supply any of X (X is a natural number) selection signals to the gate electrode of each of the N transistors so that the N transistors turn on, in the first operation mode, wherein the pixel data signal output circuit is configured to supply any of the Y pixel data signals to each of the N first electrodes through each of the N transistors in the first operation mode, wherein the display control circuit is configured to sequentially stop supply of a start signal, a clock signal and power supply voltage to the selection signal output circuit and the pixel data signal output circuit in this order to stop operations of the selection signal output circuit and the pixel data signal output circuit in the second operation mode, wherein the N transistors are configured to remain off during the second operation mode, and wherein the pixel portion is configured to hold the Y pixel data signals which are supplied in the first operation mode so that the image in accordance with the image signal is displayed on the pixel portion during the second operation mode.

8. The liquid crystal display device according to claim 7, wherein each of the N and the K is 3, and
wherein the K color filters including a color filter transmitting light of red, a color filter transmitting light of green, and a color filter transmitting light of blue.

9. The liquid crystal display device according to claim 7, wherein the N is 4 and the K is 3, and
wherein the K color filters including a color filter transmitting light of red, a color filter transmitting light of green, and a color filter transmitting light of blue.

10. The liquid crystal display device according to claim 7, wherein the backlight unit further comprises a light control circuit configured to control the light emitted from the backlight unit.

11. The liquid crystal display device according to claim 7, wherein the oxide semiconductor layer has a carrier concentration lower than $1 \times 10^{14}$ /cm$^3$.

12. The liquid crystal display device according to claim 7, further comprising a control signal generation circuit comprising a memory circuit and a comparison circuit,
wherein the control signal generation circuit is configured to generate the control signal in accordance with a difference between data of image signals in successive frame period stored in the memory circuit.

13. The liquid crystal display device according to claim 7, wherein the control signal is generated in accordance with input from a user with an input device.

14. The liquid crystal display device according to claim 7, wherein an off-state current of the transistor is less than or equal to 100 yA per micrometer of a channel width.

15. The liquid crystal display device according to claim 7, wherein the pixel portion is configured to hold the Y pixel data signals which are supplied in the first operation mode for 10 seconds or longer so that the image in accordance with the image signal is displayed on the pixel portion during the second operation mode.

* * * * *